(12) United States Patent
Yamamoto

(10) Patent No.: US 9,153,545 B2
(45) Date of Patent: Oct. 6, 2015

(54) LIGHT-EMITTING ELEMENT UNIT AND LIGHT-EMITTING ELEMENT PACKAGE

(75) Inventor: Hiroki Yamamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 182 days.

(21) Appl. No.: 13/991,161

(22) PCT Filed: Dec. 15, 2011

(86) PCT No.: PCT/JP2011/079055
§ 371 (c)(1),
(2), (4) Date: May 31, 2013

(87) PCT Pub. No.: WO2012/086517
PCT Pub. Date: Jun. 28, 2012

(65) Prior Publication Data
US 2013/0240922 A1    Sep. 19, 2013

(30) Foreign Application Priority Data

Dec. 20, 2010   (JP) ................................. 2010-283366

(51) Int. Cl.
*H01L 29/866*     (2006.01)
*H01L 23/62*     (2006.01)
(Continued)

(52) U.S. Cl.
CPC . *H01L 23/62* (2013.01); *F21K 9/17* (2013.01); *H01L 23/481* (2013.01); *H01L 25/167* (2013.01); *H01L 33/36* (2013.01); *H01L 33/486* (2013.01); *H01L 33/62* (2013.01);
(Continued)

(58) Field of Classification Search
CPC ............ H01L 29/66106; H01L 29/886; H01L 2924/12035
See application file for complete search history.

(56) References Cited

U.S. PATENT DOCUMENTS 6,876,008 B2    4/2005    Bhat et al.
7,825,422 B2    11/2010    Maeda et al.
(Continued)

FOREIGN PATENT DOCUMENTS

JP    2001-237458 A    8/2001
JP    2003-060243 A    2/2003
(Continued)

*Primary Examiner* — Jae Lee
(74) *Attorney, Agent, or Firm* — Rabin & Berdo, P.C.

(57) ABSTRACT

A light-emitting element according to the present invention includes a semiconductor light-emitting element having a front surface and a rear surface so that light is extracted from the rear surface, and having a first n-side electrode and a first p-side electrode on the front surface, and a support element having a conductive substrate having a front surface and a rear surface as well as a second n-side electrode and a second p-side electrode formed on the front surface of the conductive substrate, the first n-side electrode and the second n-side electrode, and the first p-side electrode and the second p-side electrode are so bonded to one another respectively that the semiconductor light-emitting element is supported by the support element in a facedown posture downwardly directing the front surface, and the support element has an n-side external electrode and a p-side external electrode formed on the rear surface of the conductive substrate, a conductive via passing through the conductive substrate from the front surface up to the rear surface for electrically connecting the second n-side electrode and the n-side external electrode and/or the second p-side electrode and the p-side external electrode with each other, and an insulating film formed between the via and the conductive substrate to cover the side surface of the via.

34 Claims, 23 Drawing Sheets

(51) Int. Cl.
    *H01L 25/16* (2006.01)
    *H01L 33/48* (2010.01)
    *H01L 33/62* (2010.01)
    *H01L 23/48* (2006.01)
    *H01L 33/36* (2010.01)
    *F21K 99/00* (2010.01)
    *H01L 25/075* (2006.01)
    *H01L 33/52* (2010.01)
    *F21V 23/00* (2015.01)
    *F21Y 101/02* (2006.01)
    *F21Y 103/00* (2006.01)

(52) U.S. Cl.
    CPC ........... *F21V 23/005* (2013.01); *F21Y 2101/02* (2013.01); *F21Y 2103/003* (2013.01); *H01L 25/0753* (2013.01); *H01L 33/52* (2013.01); *H01L 2224/16145* (2013.01); *H01L 2224/16245* (2013.01); *H01L 2933/0066* (2013.01)

(56) References Cited

U.S. PATENT DOCUMENTS

| | | |
|---|---|---|
| 2005/0023548 A1 | 2/2005 | Bhat et al. |
| 2007/0252523 A1 | 11/2007 | Maeda et al. |
| 2009/0179207 A1* | 7/2009 | Chitnis et al. .................. 257/88 |
| 2010/0006864 A1* | 1/2010 | Steigerwald .................. 257/88 |

FOREIGN PATENT DOCUMENTS

| | | |
|---|---|---|
| JP | 2005-057265 A | 3/2005 |
| JP | 2007-180096 A | 7/2007 |
| JP | 2008-085113 A | 4/2008 |
| JP | 2008-235792 A | 10/2008 |
| JP | 2008-277409 A | 11/2008 |
| JP | 2009-094319 A | 4/2009 |
| JP | 2009-130237 A | 6/2009 |
| WO | 2006/019090 A1 | 2/2006 |

\* cited by examiner

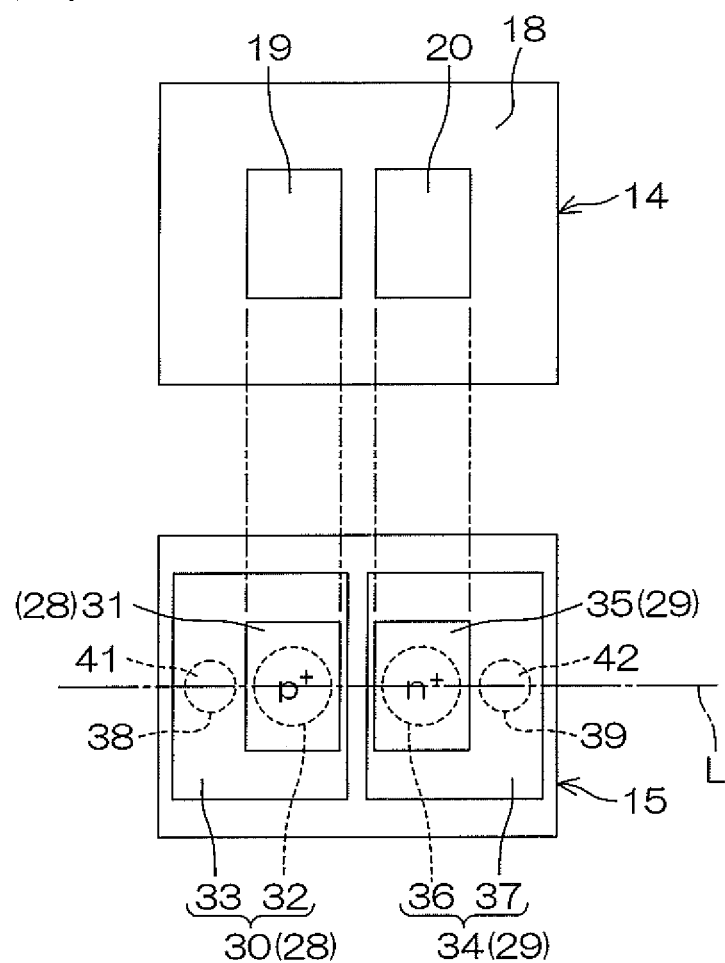

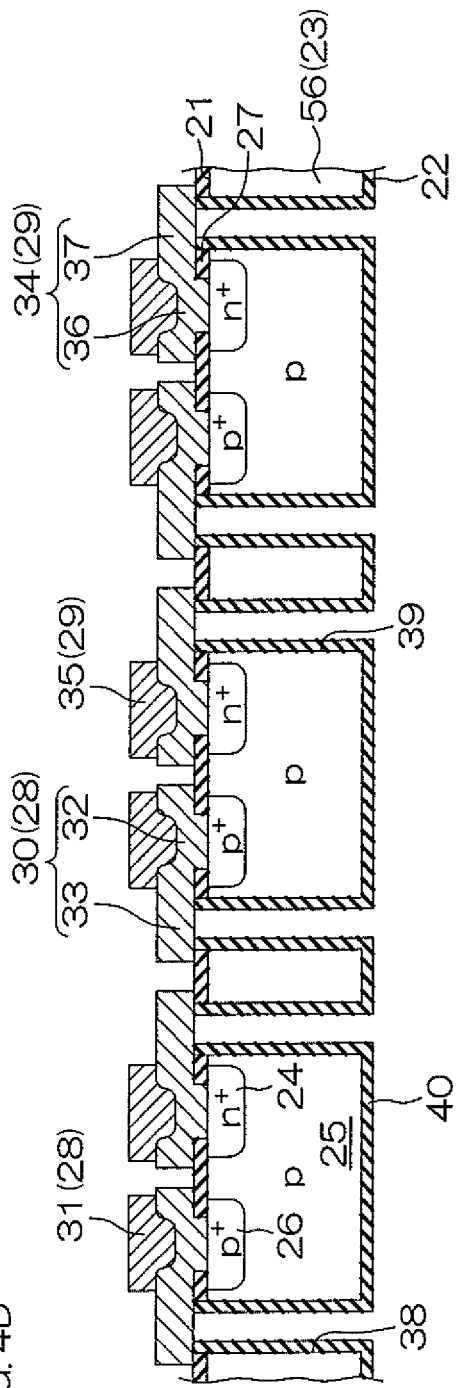

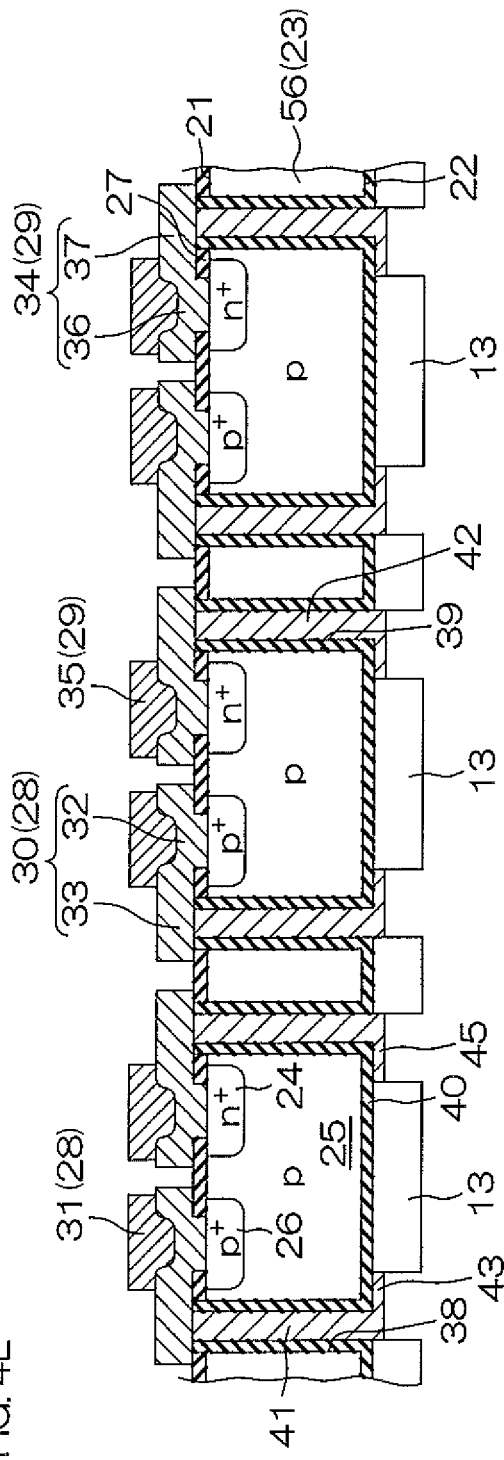

LIGHT-EMITTING ELEMENT UNIT AND LIGHT-EMITTING ELEMENT PACKAGE

TECHNICAL FIELD

The present invention relates to a light-emitting element unit and a light-emitting element package.

BACKGROUND ART

A light emitter disclosed in Patent Document 1 includes an insulated substrate formed by a white alumina ceramics substrate, a light-emitting element and a Zener diode loaded on the insulated substrate adjacently to each other, and a resin sealing portion sealing the light-emitting element and the Zener diode. The Zener diode is connected in parallel to the light-emitting element, and prevents flowing of an excess reverse current to the light-emitting element, for example.

PRIOR ART

Patent Document

Patent Document 1: Japanese Unexamined Patent Publication No. 2008-85113

SUMMARY OF THE INVENTION

Problems to be Solved by the Invention

The light emitter according to Patent Document 1 is loaded with the light-emitting element and the Zener diode adjacently to each other, and hence the same requires the insulated substrate having a space loadable with the two elements. Therefore, the structure of the overall light emitter is disadvantageously increased in size.

If the light-emitting element and the Zener diode can be brought into a stack structure, on the other hand, the insulated substrate requires only a space for one element thereon, and hence downsizing (shrinking) of the light emitter might be attained as a whole.

However, problems such as a connection structure between the light-emitting element and the Zener diode, a method of supplying power to the light-emitting element and the like still remain.

An object of the present invention is to provide a light-emitting element unit capable of attaining downsizing by a stack structure of a semiconductor light-emitting element and a support element and capable of normally supplying power to the semiconductor light-emitting element, and a light-emitting element package including the light-emitting element unit.

Solutions to Problems

A light-emitting element unit according to the present invention for attaining the aforementioned object includes a semiconductor light-emitting element having a front surface and a rear surface so that light is extracted from the rear surface, and having a first n-side electrode and a first p-side electrode on the front surface, and a support element having a conductive substrate having a front surface and a rear surface as well as a second n-side electrode and a second p-side electrode formed on the front surface of the conductive substrate, in which the first n-side electrode and the second n-side electrode, and the first p-side electrode and the second p-side electrode are so bonded to one another respectively that the semiconductor light-emitting element is supported by the support element in a facedown posture downwardly directing the front surface, and the support element has an n-side external electrode and a p-side external electrode formed on the rear surface of the conductive substrate, a conductive via passing through the conductive substrate from the front surface up to the rear surface for electrically connecting the second n-side electrode and the n-side external electrode and/or the second p-side electrode and the p-side external electrode with each other, and an insulating film formed between the via and the conductive substrate to cover the side surface of the via.

According to this structure, the semiconductor light-emitting element is bonded to the support element in the so-called facedown posture downwardly directing the surface (the front surface) for forming the electrodes. Thus, the semiconductor light-emitting element and the support element can be brought into a stack structure, whereby downsizing (shrinking) of the structure can be attained.

Further, at least one of the second n-side electrode and the second p-side electrode bonded to the respective ones of the first n-side electrode and the first p-side electrode of the semiconductor light-emitting element is electrically connected to the external electrode (the n-side external electrode or the p-side external electrode) by the via passing through the conductive substrate of the support element in the thickness direction. The side surface of the via conducting the second n-side electrode and/or the second p-side electrode and the external electrode(s) is covered with the insulating film, whereby the via is insulated from the conductive substrate. Therefore, the via and the conductive substrate can be prevented from short-circuiting when power is supplied to the semiconductor light-emitting element from the external electrode(s) through the via. Consequently, power can be normally supplied to the semiconductor light-emitting element.

Preferably in the light-emitting element unit according to the present invention, the second n-side electrode and the second p-side electrode connected to the via include wires set along the front surface of the conductive substrate and connected to the respective ones of the conductive substrate and the via, and bumps formed on the wires and bonded to the first n-side electrode or the first p-side electrode.

According to this structure, the conductive substrate and the via are connected with each other by the wires, whereby flexibility of the position for forming the via can be spread by properly changing the patterns of the wires. Thus, an element forming region where a diode or the like is formed and a via forming region where the via is formed can be separated from each other in the conductive substrate. Consequently, the via passing through the conductive substrate can be formed without inhibiting the element forming region also in a downsized light-emitting element unit.

Preferably, the light-emitting element unit according to the present invention further includes a resistive element interposed between positions of the wires to which the via is connected and positions connected with the bumps.

According to this structure, the resistive element is connected in series to the semiconductor light-emitting element, whereby a current flowing in the semiconductor light-emitting element can be excellently controlled to the rated current of the light-emitting element by properly setting the resistance value of the resistive element.

Preferably in the light-emitting element unit according to the present invention, the first n-side electrode and the first p-side electrode connected to the bumps are provided in the form of bumps made of the same metallic material as the bumps. The metallic material may be Au.

In the light-emitting element unit according to the present invention, the wires may be made of Al.

Preferably in the light-emitting element unit according to the present invention, the conductive substrate has a p-type region to which the second n-side electrode is connected and an n-type region to which the second p-side electrode is connected, and the via includes an n-side via and a p-side via connected to the respective ones of the second n-side electrode and the second p-side electrode in a case where the support element includes a Zener diode having a p-n junction of the n-type region and the p-type region.

According to this structure, the Zener diode can be connected in parallel to the semiconductor light-emitting element. Therefore, flowing of an excess reverse current to the semiconductor light-emitting element can be prevented.

Preferably in a case where the conductive substrate is a p-type semiconductor substrate as the p-type region and the n-type region is a region floated on a surface layer portion of the p-type semiconductor substrate, for example, the p-side via passes through the p-type semiconductor substrate not to be in contact with the floated n-type region.

According to these structures, the n-type region (the floated region) forming the p-n junction of the Zener diode is not inhibited by the n-side via. Therefore, the Zener diode can sufficiently exhibit action of protecting the semiconductor light-emitting element against an overcurrent.

Preferably in a case where the p-type semiconductor substrate includes a $p^+$-type contact region formed adjacently to the n-type region on the surface layer portion thereof so that the second n-side electrode is connected thereto, the p-side via is formed on a side of the n-type region opposite to the $p^+$-type contact region, and the n-side via is formed on a side of the $p^+$-type contact region opposite to the n-type region. More specifically, the n-side via, the n-type region, the $p^+$-type contact region and the p-side via may be arranged on the same straight line in plan view.

Preferably in the light-emitting element unit according to the present invention, the conductive substrate has a driving circuit driving a plurality of semiconductor light-emitting elements respectively, the support element includes a driving element supporting the plurality of semiconductor light-emitting elements, and the via is electrically connected to the respective ones of the second n-side electrode and the second p-side electrode.

According to this structure, the plurality of light-emitting elements can be brought into a stack structure with respect to one driving element, whereby downsizing (shrinking) of the structure can be attained.

The plurality of semiconductor light-emitting elements may be light-emitting elements whose emission wavelengths are different from one another. More specifically, the plurality of semiconductor light-emitting elements may include a red LED element, a green LED element and a blue LED element. Preferably in this case, the first n-side electrodes of the respective ones of the red LED element, the green LED element and the blue LED element are connected to the common second n-side electrode.

A light-emitting element package according to the present invention can be constituted by supporting the light-emitting element unit according to the present invention by a base substrate having a cathode terminal and an anode terminal and surrounding the periphery thereof with a resin case.

BRIEF DESCRIPTION OF THE DRAWINGS

[FIG. 3] A bottom plan view and a plan view of an LED chip and a diode chip shown in FIG. 2.

[FIG. 4D] A diagram showing a step subsequent to FIG. 4C.

[FIG. 4E] A diagram showing a step subsequent to FIG. 4D.

MODES FOR CARRYING OUT THE INVENTION

Embodiments of the present invention are now described in detail with reference to the attached drawings.

<First Embodiment>

Figure 1:
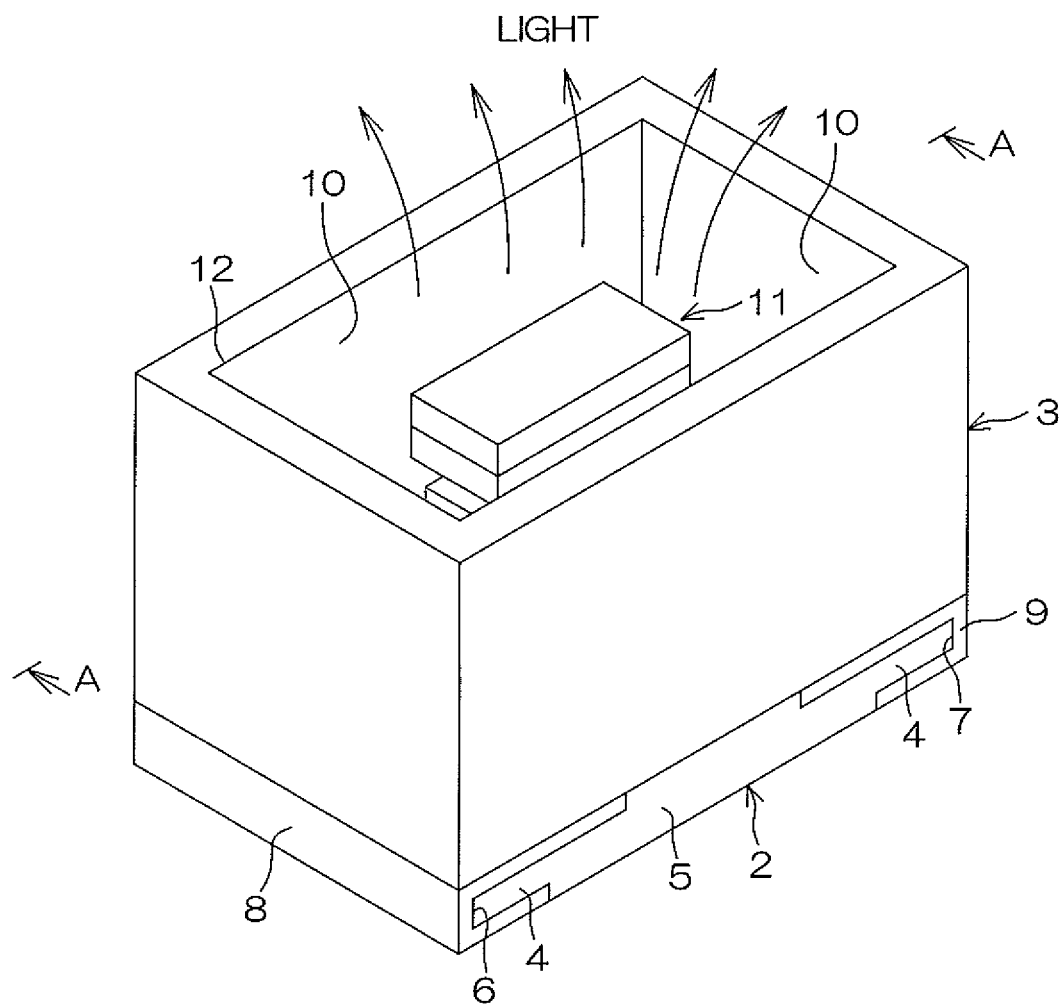
[FIG. 1] A schematic perspective view of an LED package according to a first embodiment of the present invention.

FIG. 1 is a schematic perspective view of an LED package according to a first embodiment of the present invention.

An LED package 1 is employed for a signal, an electric bulletin board, a backlight of a liquid crystal display, various lighting fixtures such as lamps of an automobile and a bicycle, an exposure light source of an electrophotographic printer or the like, for example.

The LED package 1 includes a base substrate 2 and a resin case 3 mounted on the base substrate 2.

The base substrate 2 is provided in the form of a rectangular plate as a whole, by fitting a cathode terminal 8 and an anode terminal 9 of metals having recesses 6 and 7 with projections 4 of an insulating substrate 5 having the projections 4 on end portions. The cathode terminal 8 and the anode terminal 9 form longitudinal end portions of the base substrate 2 respectively.

The resin case 3 is provided in the form of walls forming a quadrangular ring along peripheral edges of the base substrate 2, to surround a central portion of the base substrate 2. As to four inner surfaces 10 (surfaces closer to the central portion of the base substrate 2) of the wall-shaped resin case 3, mutually opposed pairs of surfaces are formed as tapered surfaces spreading from the front surface of the base substrate 2 toward a top portion respectively. The inner surfaces 10 function as reflectors (reflecting plates).

Figure 2:
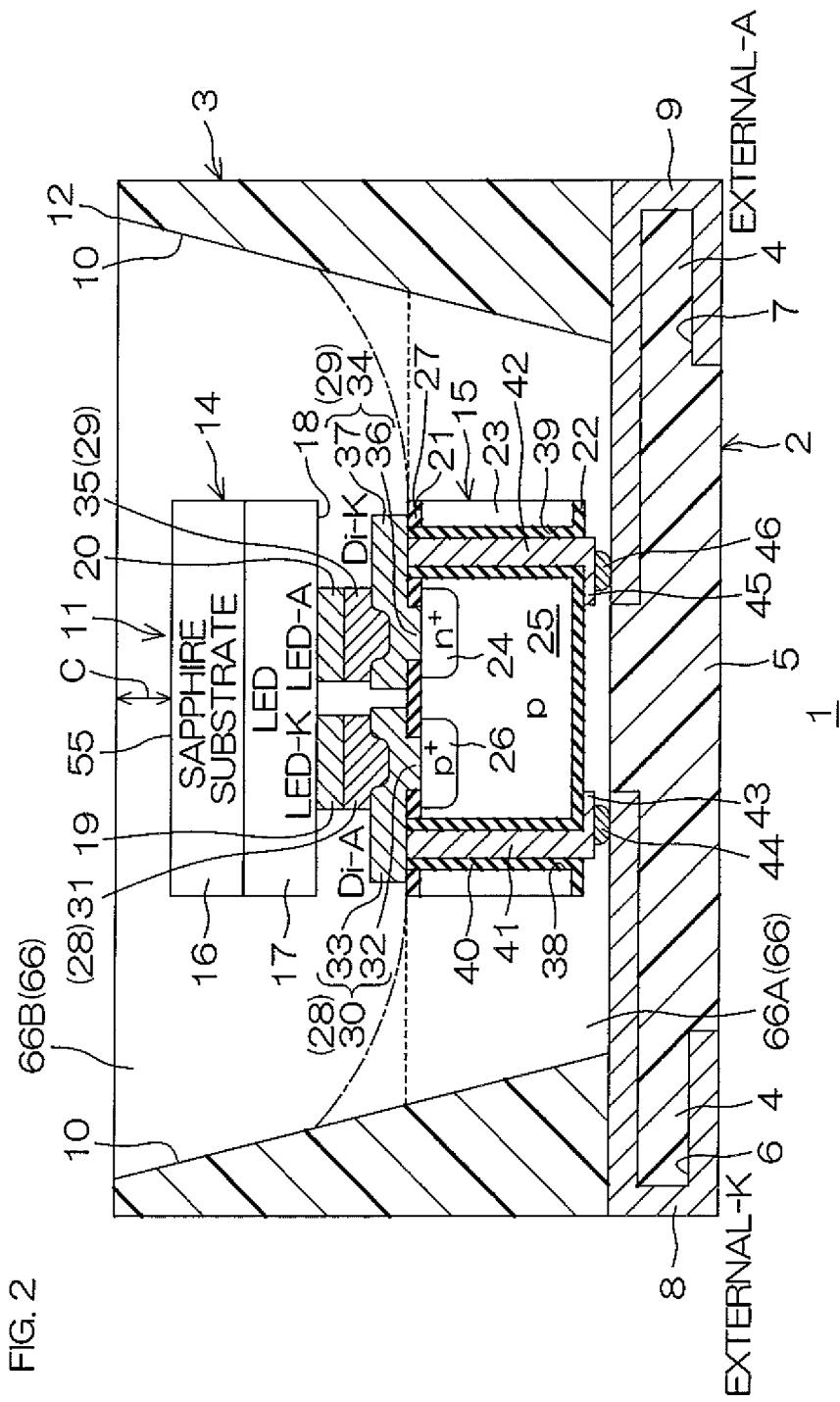
[FIG. 2] A sectional view of the LED package shown in FIG. 1, showing a section along a cutting plane line A-A in FIG. 1.

An LED element unit 11 as a light-emitting element unit is loaded on the central portion of the base substrate 2 surrounded by the resin case 3. Light emitted in the LED element unit 11 is radiated from an open surface 12 (a surface opposite to the base substrate 2) of a resin package. Translucent resin 66 may be injected into the portion surrounded by the resin case 3 to cover the LED element unit 11, as shown in FIG. 2. More specifically, it is preferable that white resin 66A is injected into a lower portion of the resin case 3 to cover a diode chip 15 and wavelength converting resin 66B is injected into an upper portion of the resin case 3 to cover an LED chip 14. The white resin 66A is so provided under the LED chip 14 that luminous efficiency can be improved by suppressing absorption of light. The wavelength converting resin 66B may have a lens shape, while the white resin 66A may be formed in a bent manner so that a peripheral portion thereof is thicker as compared with a central portion, as shown by one-dot chain lines in FIG. 2, for example. In other words, a portion of the white resin 66A covering the diode chip 15 may be relatively thin, and a portion in contact with the resin case 3 may be relatively thick.

FIG. 2 is a sectional view of the LED package shown in FIG. 1, showing a section along a cutting plane line A-A in FIG. 1. FIG. 3 is a bottom plan view and a plan view of the LED chip and the diode chip shown in FIG. 2.

The LED element unit 11 is provided on the central portion of the base substrate 2.

The LED element unit 11 includes the LED chip 14 as a semiconductor light-emitting element and the diode chip 15 as a support element supporting the LED chip 14.

The LED chip 14 is prepared by forming a light-emitting diode structure (an LED layer 17) consisting of a group III nitride semiconductor layer on one major surface of a sapphire substrate 16 as a transparent substrate.

An LED cathode electrode 19 as a first n-side electrode and an LED anode electrode 20 as a first p-side electrode are formed on a front surface 18 of the LED layer 17. The LED cathode electrode 19 and the LED anode electrode 20 are provided in the form of bumps made of Au, and provided adjacently to each other. In the following description, the "n-side" and the "p-side" are based on a cathode side (the n-side) and an anode side (the p-side) of the LED chip 14.

Light emitted from the LED layer 17 is transmitted through the sapphire substrate 16 and radiated from the open surface 12 of the resin package (see FIG. 1).

The diode chip 15 includes a p-type silicon substrate 23 (whose p-type impurity concentration is about $1\times10^{19}$ cm$^3$, for example) as a conductive substrate having a front surface 21 and a rear surface 22. An n$^+$-type region 24 (whose n-type impurity concentration is about $1\times10^{20}$ cm$^3$, for example) is formed on a surface layer portion of the surface (the front surface 21) of the p-type silicon substrate 23 opposed to the LED chip 14. The n$^+$-type region 24 is a region of the p-type silicon substrate 23 floated as an island quadrangular in plan view, for example.

Thus, the n$^+$-type region 24 and a p-type region 25 excluding the n$^+$-type region 24 are formed on the p-type silicon substrate 23, and a structure of a Zener diode having a p-n junction of the n$^+$-type region 24 and the p-type region 25 is formed. The Zener diode having such a structure has a Zener voltage decided by the concentration relation between the n$^+$-type region 24 and the p-type region 25. When a prescribed reverse voltage is applied to the Zener diode, a Zener breakdown takes place on the interface between the n$^+$-type region 24 and the p-type region 25. In other words, the diode chip 15 functions as a protective element for the LED chip 14. Therefore, the LED chip 14 and the diode chip 15 constitute a light-emitting element circuit having a protective circuit in association with each other.

A p$^+$-type contact region 26 (whose p-type impurity concentration is about $1\times10^{20}$ cm$^3$, for example) having a higher p-type impurity concentration than the p-type region 25 is formed on the surface layer portion of the p-type silicon substrate 23. The p$^+$-type contact region 26 is a region floated as an island quadrangular in plan view, for example, similarly to the n$^+$-type region 24, and formed adjacently to the n$^+$-type region 24.

A surface protective film 27 made of SiO$_2$ is formed on the front surface 21 of the p-type silicon substrate 23.

A diode anode electrode 28 as a second n-side electrode and a diode cathode electrode 29 as a second p-side electrode are formed on the surface protective film 27.

The diode anode electrode 28 includes an n-side wire 30 made of Al and an n-side bump 31 made of Au.

The n-side wire 30 integrally has an n-side contact portion 32 positioned immediately above the p$^+$-type contact region 26 and connected to the p$^+$-type contact region 26 through the surface protective film 27 and an n-side drawn-out portion 33 drawn out from the n-side contact portion 32 to a side opposite to the n$^+$-type region 24 in plan view. The n-side drawn-out portion 33 made of Al functions as a relay wire connecting the p$^+$-type contact region 26 and an n-side via 41 (described later) with each other, and also functions as a light reflector on the front surface of the diode chip 15. Therefore, a light reflecting area increases as the area of the n-side drawn-out portion 33 is increased, whereby light reflectance can be improved. The reflectance may be further improved by further forming a reflecting film after providing an insulating film, for example, on the side surface of the diode chip 15.

The n-side bump 31 is bonded onto the n-side contact portion 32 of the n-side wire 30, and arranged immediately above the p$^+$-type contact region 26.

The diode cathode electrode 29 includes a p-side wire 34 made of Al and a p-side bump 35 made of Au.

The p-side wire 34 integrally includes a p-side contact portion 36 positioned immediately above the n$^+$-type region 24 and connected to the n$^+$-type region 24 through the surface protective film 27 and a p-side drawn-out portion 37 drawn out from the p-side contact portion 36 toward a side opposite to the p$^+$-type contact region 26 in plan view. The p-side drawn-out portion 37 made of Al functions as a relay wire connecting the n$^+$-type region 24 and a p-side via 42 (described later) with each other, and also functions as a light reflector on the front surface of the diode chip 15. Therefore, a light reflecting area increases as the area of the p-side drawn-out portion 37 is increased, whereby the light reflectance can be improved.

The p-side bump 35 is bonded onto the p-side contact portion 36 of the p-side wire 34, and arranged immediately above the $n^+$-type region 24.

The p-type silicon substrate 23 is provided with an n-side via hole 38 and a p-side via hole 39 passing through the surface protective film 27 from the rear surface 22 thereof to reach the respective ones of the n-side wire 30 and the p-side wire 34. The n-side via hole 38 and the p-side via hole 39 are quadrangularly formed in plan view, for example.

The n-side via hole 38 passes through a side portion of the $p^+$-type contact region 26 not to be in contact with the $p^+$-type contact region 26, and is arranged on a position overlapping the n-side drawn-out portion 33 in plan view. The p-side via hole 39 passes through a side portion of the $n^+$-type region 24 not to be in contact with the $n^+$-type region 24, and is arranged on a position overlapping the p-side drawn-out portion 37 in plan view. More specifically, the n-side via hole 38 and the p-side via hole 39 are arranged on the same straight line (a one-dot chain line L in FIG. 3) along with the $n^+$-type region 24 and the $p^+$-type contact region 26, not to overlap one another in plan view.

Thus, constant spaces are provided between the n-side via hole 38 and the $p^+$-type contact region 26 and between the p-side via hole 39 and the $n^+$-type region 24 respectively.

An insulating film 40 made of $SiO_2$ is integrally formed on the inner surfaces of the n-side via hole 38 and the p-side via hole 39 as well as the rear surface 22 of the p-type silicon substrate 23.

The n-side via 41 and the p-side via 42 made of Cu are formed to fill up the inner sides of the insulating film 40 in the n-side via hole 38 and the p-side via hole 39. It follows that the n-side via 41 is connected to the n-side drawn-out portion 33 and the p-side via 42 is connected to the p-side drawn-out portion 37. The n-side via 41 and the p-side via 42 may be tapered vias whose diameters gradually decrease in the direction from the front surface 21 toward the rear surface 22 of the p-type silicon substrate 23.

An n-side island 43 drawn out from the n-side via 41 along the rear surface 22 of the p-type silicon substrate 23 is formed on a portion of the insulating film 40 located on the rear surface 22 of the p-type silicon substrate 23, integrally with the n-side via 41. An n-side external bump 44 made of solder as an n-side external electrode is bonded to the n-side island 43.

A p-side island 45 drawn out from the p-side via 42 along the rear surface 22 of the p-type silicon substrate 23 is formed on the portion of the insulating film 40 located on the rear surface 22 of the p-type silicon substrate 23, integrally with the p-side via 42. A p-side external bump 46 made of solder as a p-side external electrode is bonded to the p-side island 45.

The bumpy LED cathode electrode 19 and the n-side bump 31 (the diode anode electrode 28) as well as the bumpy LED anode electrode 20 and the p-side bump 35 (the diode cathode electrode 29) are so bonded to one another respectively that the LED chip 14 is supported by the diode chip 15 from below in a facedown posture downwardly directing the front surface 18 of the LED layer 17. Thus, the LED element unit 11 consisting of a stack structure of the LED chip 14 and the diode chip 15 is constituted. In the LED element unit 11, it follows that the LED cathode electrode 19 and the LED anode electrode 20 of the LED layer 17 and the $n^+$-type region 24 and the p-type region 25 of the Zener diode are connected in parallel to the n-side external bump 44 and the p-side external bump 46.

The n-side external bump 44 of the diode chip 15 is connected to a portion of the cathode terminal 8 projecting toward the central portion of the base substrate 2 beyond the resin case 3 and the p-side external bump 46 is connected to a portion of the anode terminal 9 projecting toward the central portion of the base substrate 2 beyond the resin case 3, whereby the LED element unit 11 is arranged on the central portion of the base substrate 2.

A proper clearance C is provided between a top surface 55 of the sapphire substrate 16 of the LED element unit 11 and the open surface 12 (the top portion) of the resin case 3, in a state where the LED element unit 11 is packaged.

FIGS. 4A to 4I are sectional views showing parts of manufacturing steps for the LED element unit shown in FIG. 2, showing cutting planes on the same position as FIG. 2.

Figure 4A:
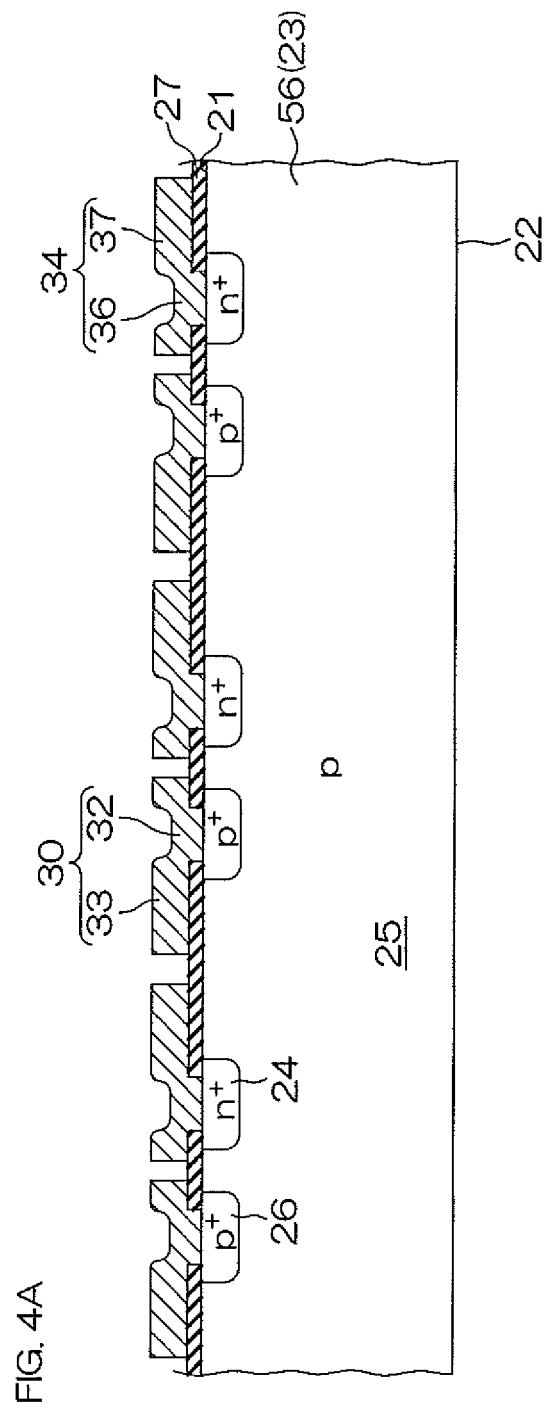
[FIG. 4A] A sectional view showing a part of manufacturing steps for an LED element unit shown in FIG. 2, showing a cutting plane line on the same position as FIG. 2.

Manufacturing of the LED element unit 11 is progressed in the state of a wafer 56 before the p-type silicon substrate 23 is cut into each individual piece. First, the $n^+$-type region 24 and the $p^+$-type contact region 26 are formed on the surface layer portion of the p-type silicon substrate 23 by a well-known ion implantation technique, as shown in FIG. 4A. Then, the surface protective film 27 made of $SiO_2$ is formed on the front surface 21 of the p-type silicon substrate 23 by thermal oxidation. Then, the surface protective film 27 is patterned by a well-known patterning technique, and openings exposing the $n^+$-type region 24 and the $p^+$-type contact region 26 are formed in the surface protective film 27. Then, an Al layer is deposited on the whole region of the surface protective film 27 by sputtering. Then, the n-side wire 30 and the p-side wire 34 of prescribed patterns are formed by patterning the deposited Al layer by a well-known patterning technique.

Figure 4B:
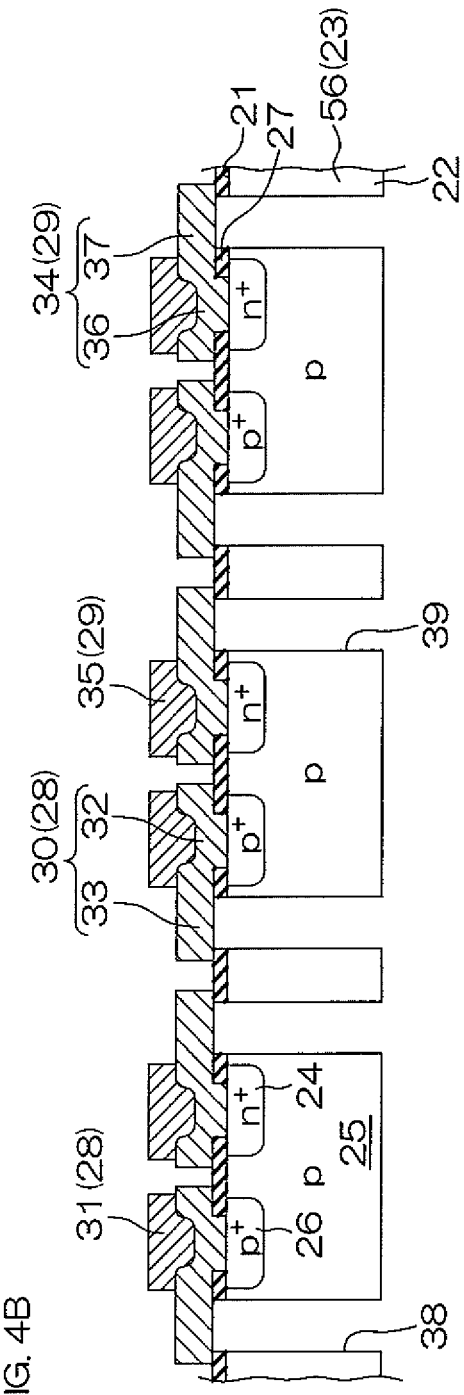
[FIG. 4B] A diagram showing a step subsequent to FIG. 4A.

Then, the n-side bump 31 and the p-side bump 35 made of Au are formed on the n-side wire 30 and the p-side wire 34, as shown in FIG. 4B. Then, the p-type silicon substrate 23 is polished from the side of the rear surface 22, to be thinned. For example, the p-type silicon substrate 23 of 700 μm in thickness is thinned to about 130 μm in thickness. Then, the n-side via hole 38 and the p-side via hole 39 reaching the respective ones of the n-side wire 30 and the p-side wire 34 are formed by etching the p-type silicon substrate 23 and the surface protective film 27 from the rear surface 22 of the p-type silicon substrate 23.

Figure 4C:
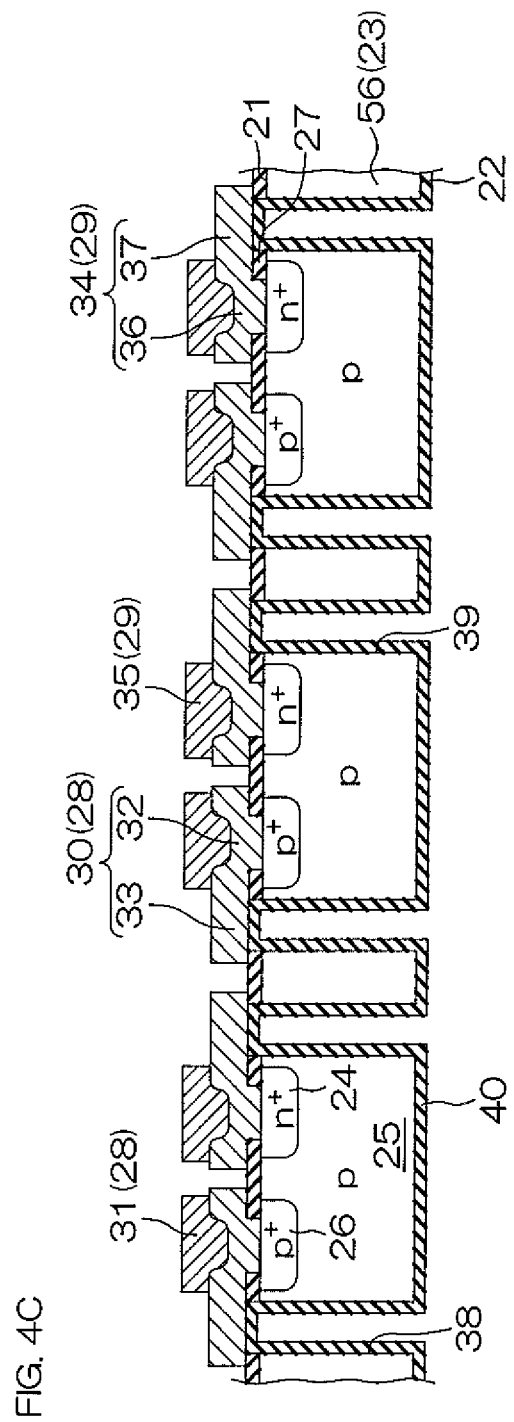
[FIG. 4C] A diagram showing a step subsequent to FIG. 4B.

Then, the insulating film 40 made of $SiO_2$ is formed on the inner surfaces of the n-side via hole 38 and the p-side via hole 39 as well as the rear surface 22 of the p-type silicon substrate 23 by CVD (Chemical Vapor Deposition), as shown in FIG. 4C.

Then, portions of the insulating film 40 on the n-side wire 30 and the p-side wire 34 are selectively removed by etching, as shown in FIG. 4D.

Then, a barrier film (not shown) made of Ti is formed on the insulating film 40, and a seed film (not shown) made of Cu is formed on the barrier film by sputtering. Then, a resist 13 having openings in portions for forming the n-side island 43 and the p-side island 45 is formed on the Cu seed film and the Ti barrier film, as shown in FIG. 4E. Thereafter Cu is grown by plating in the n-side via hole 38 and the p-side via hole 39 and on the rear surface 22 of the p-type silicon substrate 23 from the Cu seed film exposed from the openings of the resist 13. Thus, the n-side via 41, the p-side via 42, the n-side island 43 and the p-side island 45 are simultaneously formed, as shown in FIG. 4E.

Figure 4F:
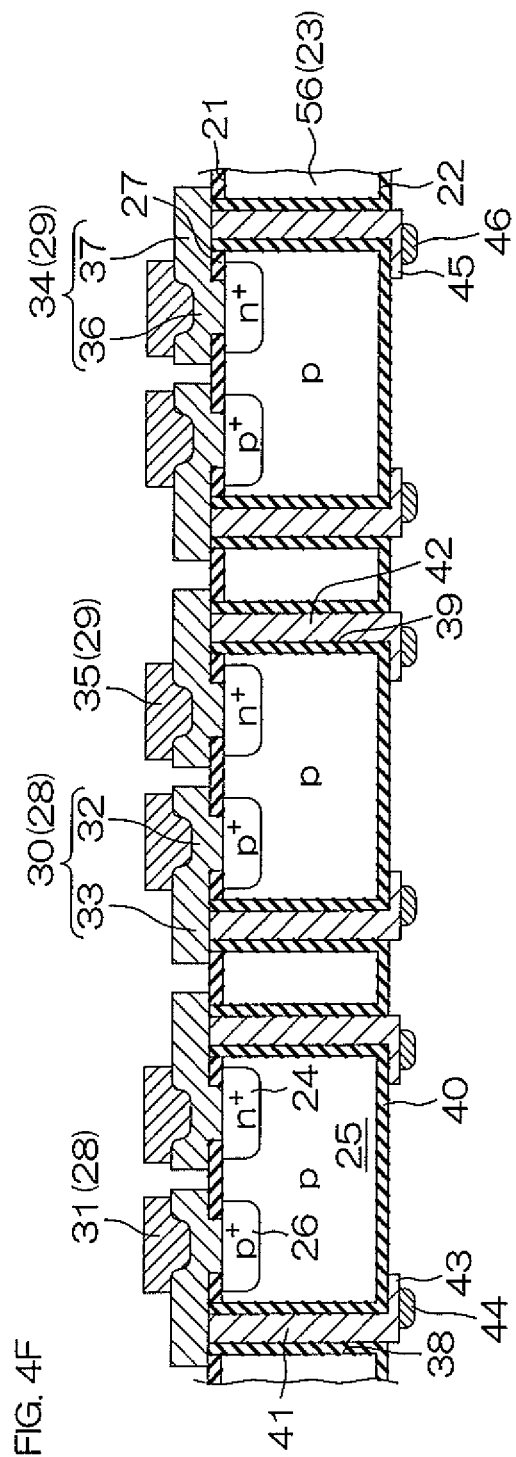
[FIG. 4F] A diagram showing a step subsequent to FIG. 4E.

Then, the resist 13 is separated, and an excess Cu seed film exposed on the portion where the resist 13 has been formed is removed, as shown in FIG. 4F. Then, the n-side external bump 44 and the p-side external bump 46 made of solder are formed on the n-side island 43 and the p-side island 45.

Figure 4G:
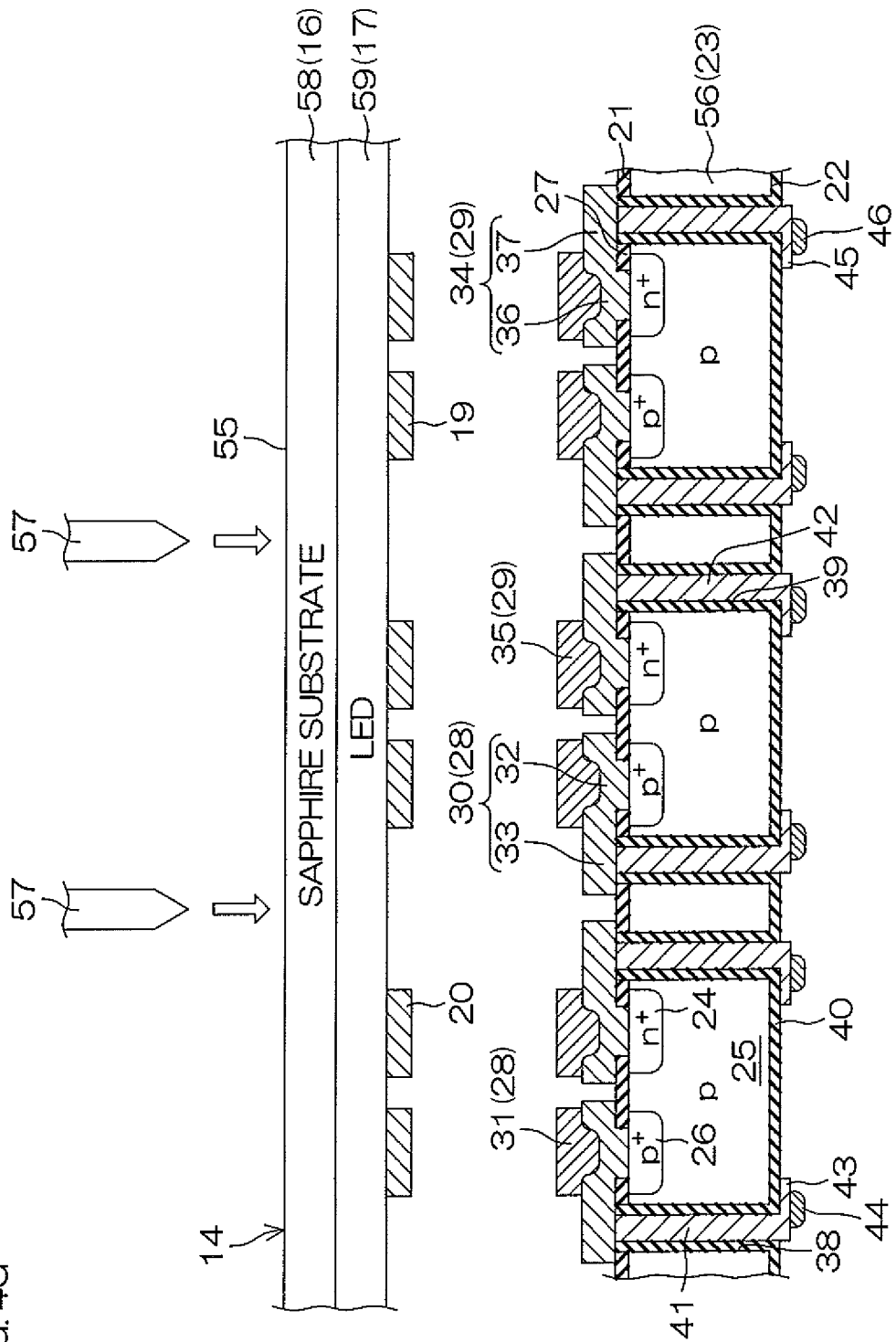
[FIG. 4G] A diagram showing a step subsequent to FIG. 4F.

Then, a dicing blade 57 is advanced from the side of the sapphire substrate 16 toward an LED wafer 59 in which the LED layer 17 is formed on the sapphire substrate 16 in the state of the wafer 58, whereby the LED chip 14 is cut on a dicing line set along the peripheral edge of each LED chip 14, as shown in FIG. 4G. Thus, the wafer 58 is singulated into each LED chip 14.

Figure 4H:
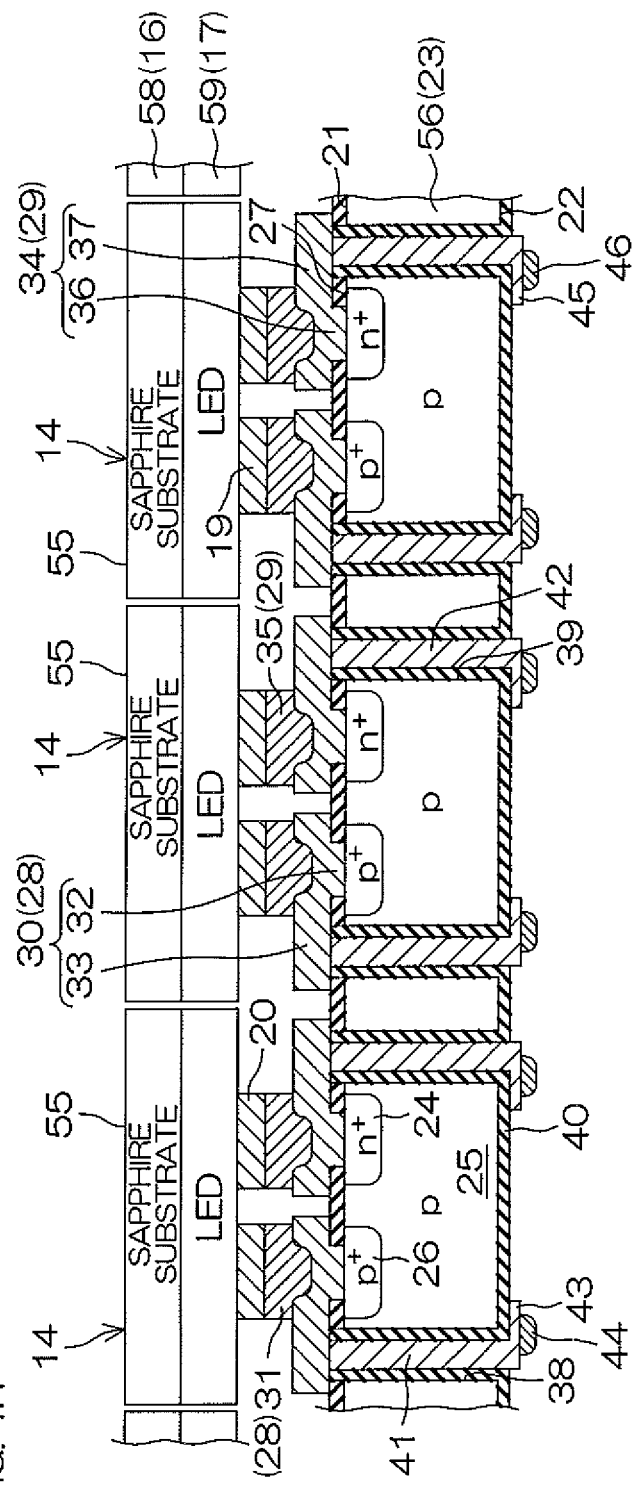
[FIG. 4H] A diagram showing a step subsequent to FIG. 4G.

Then, the LED cathode electrode 19 and the LED anode electrode 20 of each singulated LED chip 14 are bonded to the n-side bump 31 and the p-side bump 35 in a one-to-one manner, as shown in FIG. 4H.

Figure 4I:
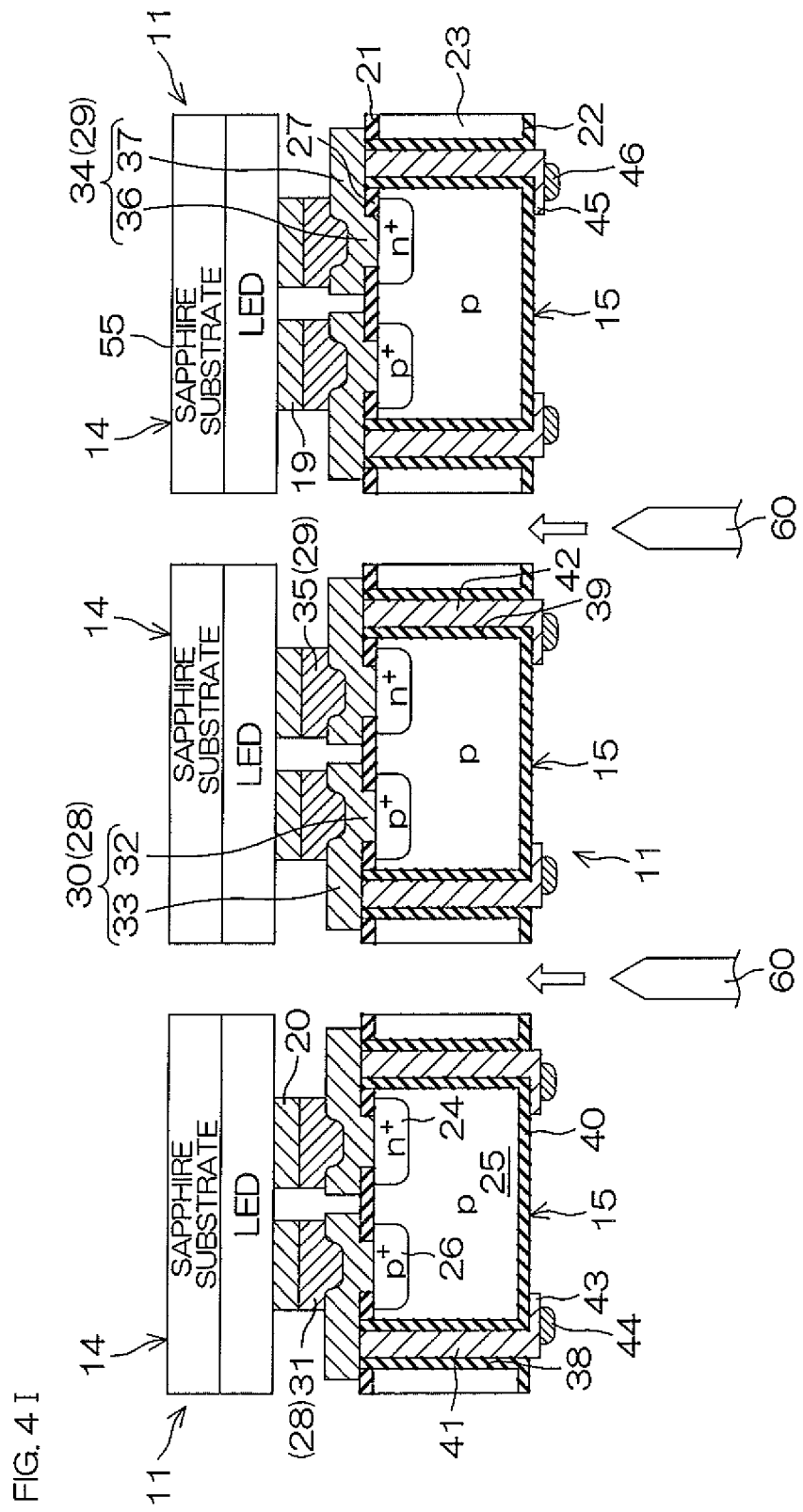
[FIG. 4I] A diagram showing a step subsequent to FIG. 4H.

Then, a dicing blade 60 is advanced from the side of the rear surface 22 of the p-type silicon substrate 23, whereby the p-type silicon substrate 23 is cut on a dicing line set along the peripheral edge of each diode chip 15, as shown in FIG. 4I. Thus, the LED element unit 11 having the stack structure of the LED chip 14 and the diode chip 15 is obtained.

According to the LED package 1, as hereinabove described, the LED chip 14 is bonded to the diode chip 15 in the so-called facedown posture downwardly directing the surface (the front surface 18) of the LED layer 17 provided with the electrodes. Thus, the LED chip 14 and the diode chip 15 can be brought into the stack structure, whereby downsizing (shrinking) of the LED element unit 11 can be attained.

Further, the diode anode electrode 28 and the diode cathode electrode 29 bonded to the respective ones of the LED cathode electrode 19 and the LED anode electrode 20 of the LED chip 14 are connected to the n-side external bump 44 and the p-side external bump 46 by the n-side via 41 and the p-side via 42 passing through the p-type silicon substrate 23 in the thickness direction respectively.

The side surfaces of the n-side via 41 and the p-side via 42 are covered with the insulating film 40, whereby the n-side via 41 and the p-side via 42 are insulated from the p-type silicon substrate 23. Therefore, the vias (the n-side via 41 and the p-side via 42) and the p-type silicon substrate 23 can be prevented from short-circuiting when power is supplied from the n-side external bump 44 and the p-side external bump 46 to the vias (the n-side via 41 and the p-side via 42). Consequently, power can be normally supplied to the LED chip 14.

The n-side wire 30 and the p-side wire 34 have the drawn-out portions (the n-side drawn-out portion 33 and the p-side drawn-out portion 37) respectively, and the n-side via 41 and the p-side via 42 are connected to the n-side drawn-out portion 33 and the p-side drawn-out portion 37. Thus, flexibility of the positions for forming the n-side via 41 and the p-side via 42 can be spread by properly changing the patterns of the drawn-out portions 33 and 37.

In other words, the n-side via 41 and the p-side via 42 can be provided not to be in contact with the $n^+$-type region 24 and the $p^+$-type contact region 26, as in the first embodiment. Also in the downsized LED element unit 11, therefore, the $n^+$-type region 24 and the $p^+$-type contact region 26 are not inhibited. Consequently, the Zener diode formed on the p-type silicon substrate 23 can sufficiently exhibit action of protecting the LED chip 14 against an overcurrent.

Further, heat generated in the LED chip 14 can be radiated to the base substrate 2 through the n-side bump 31 and the p-side bump 35 made of Au (whose thermal conductivity is about 320 W/(m·K)), the n-side wire 30 and the p-side wire 34 made of Al (whose thermal conductivity is about 236 W/(m·K)), the n-side via 41 and the p-side via 42 made of Cu (whose thermal conductivity is about 398 W/(m·K)) and thicker as compared with bonding wires and the n-side external bump 44 and the p-side external bump 46 made of solder (whose thermal conductivity is about 70 to 80 W/(m·K)), whereby heat releasability can be improved.

If the diode anode electrode 28 and the diode cathode electrode 29 have structures connected to the respective ones of the cathode terminal 8 and the anode terminal 9 of the base substrate 2 through bonding wires in FIG. 2, the bonding wires may be disconnected due to the difference between the thermal expansion coefficients of the diode chip 15 and the bonding wires. In the structure of this embodiment, on the other hand, the diode anode electrode 28 and the diode cathode electrode 29 are connected to the respective ones of the cathode terminal 8 and the anode terminal 9 of the base substrate 2 through the n-side external bump 44 and the p-side external bump 46, as shown in FIG. 2. Thus, occurrence of defective connection resulting from the aforementioned disconnection of the bonding wires or the like can be prevented.

Figure 5:
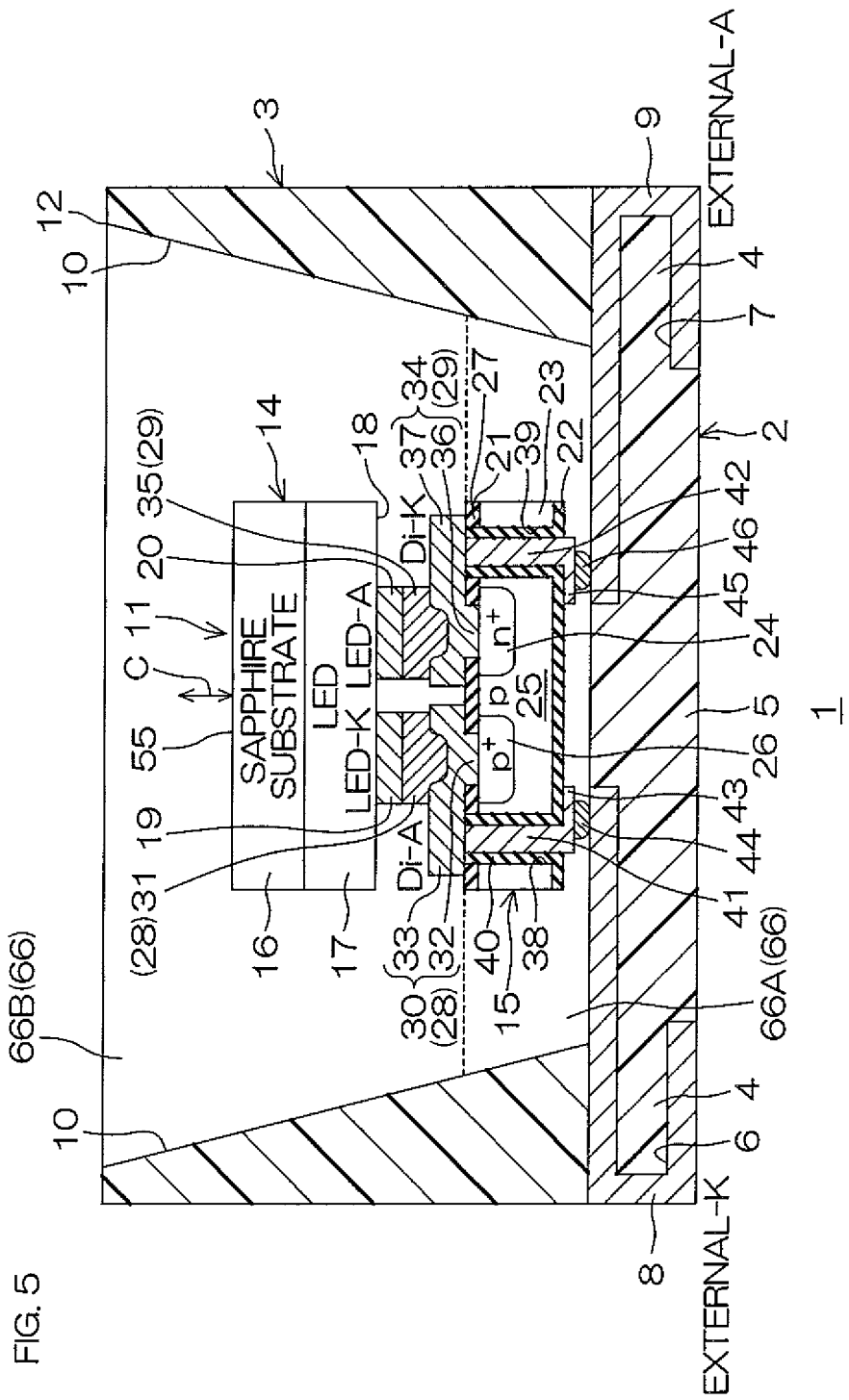
[FIG. 5] A diagram showing a modification of the diode chip of FIG. 2.

The diode chip 15 may be a thin chip such as that shown in FIG. 5. In this case, the lengths of the n-side via 41 and the p-side via 42 in the thickness direction can be reduced by setting the thickness of the diode chip 15 to 50 µm to 100 µm, for example, whereby the thermal conductivity in the direction from the front surface toward the rear surface of the diode chip 15 can be improved.

Figure 6:
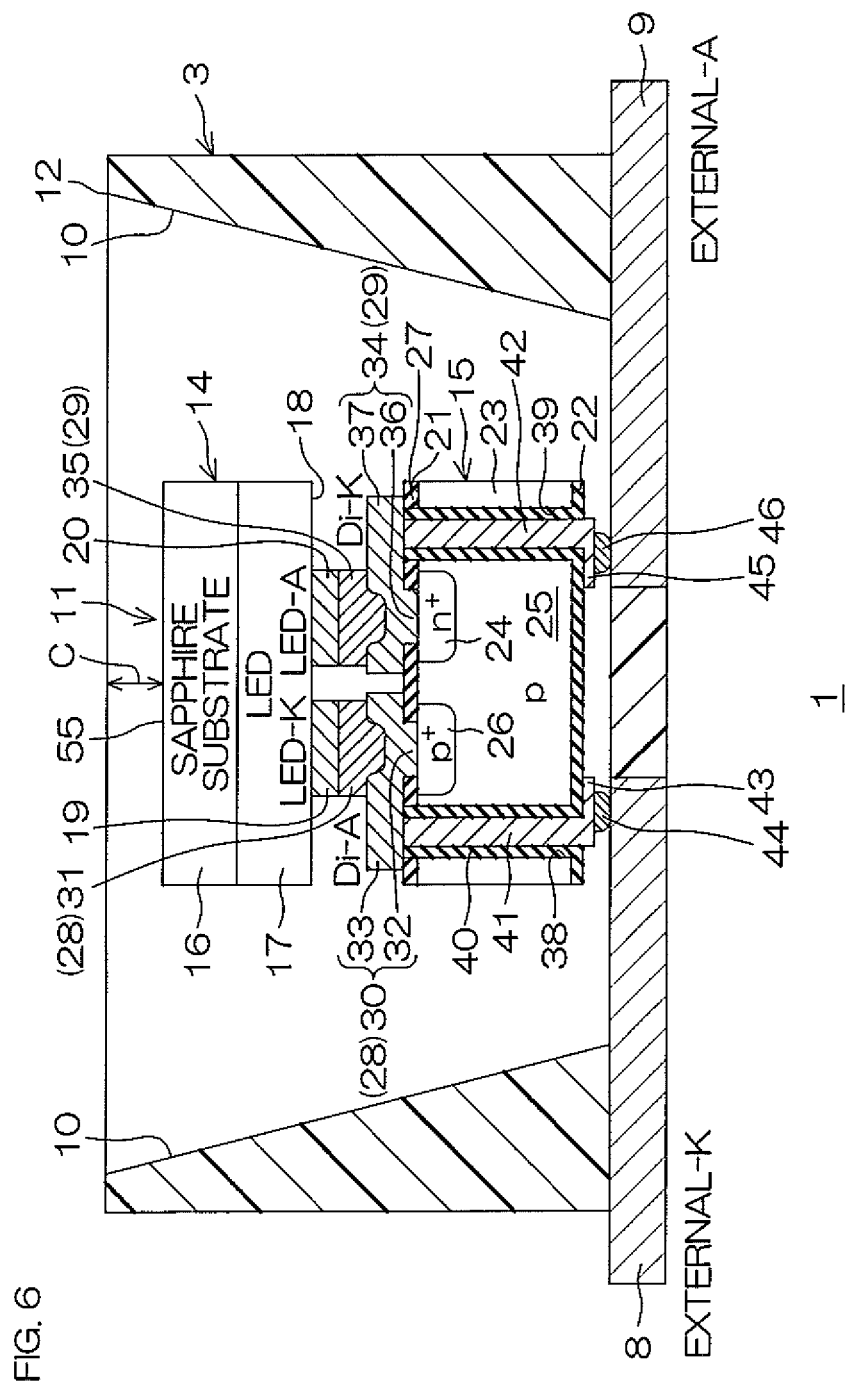
[FIG. 6] A diagram showing modifications of a cathode terminal and an anode terminal of FIG. 2.

In the LED package 1, the cathode terminal 8 and the anode terminal 9 may be lead terminals provided in the form of rectangular plates themselves, as shown in FIG. 6. In this case, it follows that the n-side external bump 44 and the p-side external bump 46 are directly connected to the lead terminals, whereby the thermal conductivity of the LED package 1 can be improved.

Figure 7:
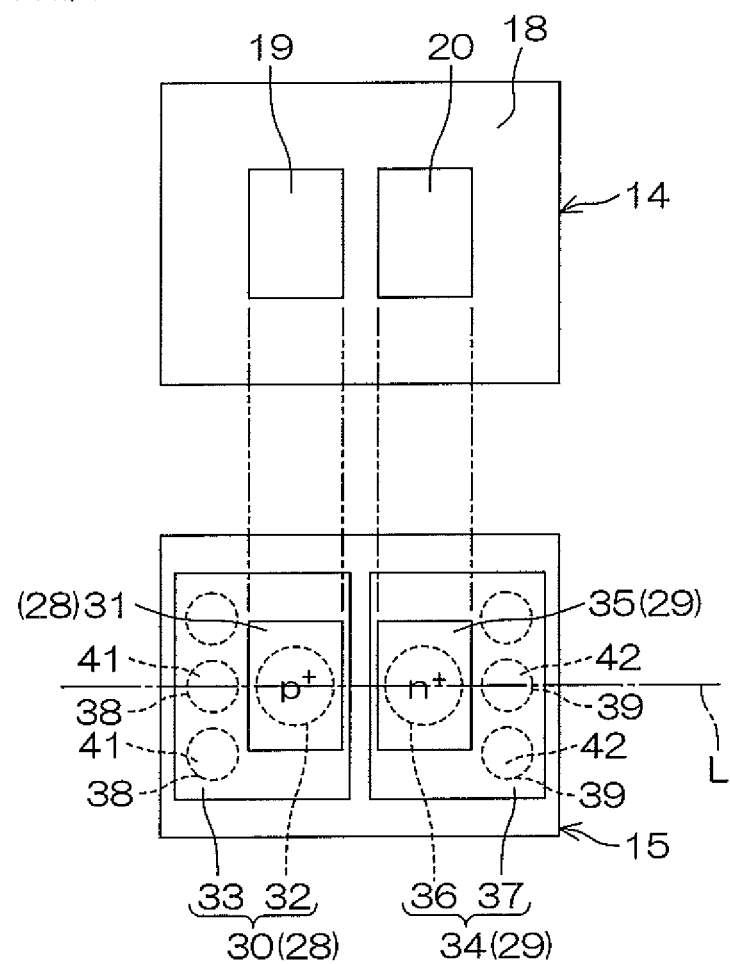
[FIG. 7] A diagram showing modifications of an n-side via and a p-side via of FIG. 3.

In the diode chip 15, the n-side via 41 and the p-side via 42 are preferably formed with the largest possible diameters, and a plurality of vias may be formed on the diode chip 15, as shown in FIG. 7. Thus, thermal conductivity in the direction from the front surface toward the rear surface of the diode chip 15 can be improved.

Figure 8:
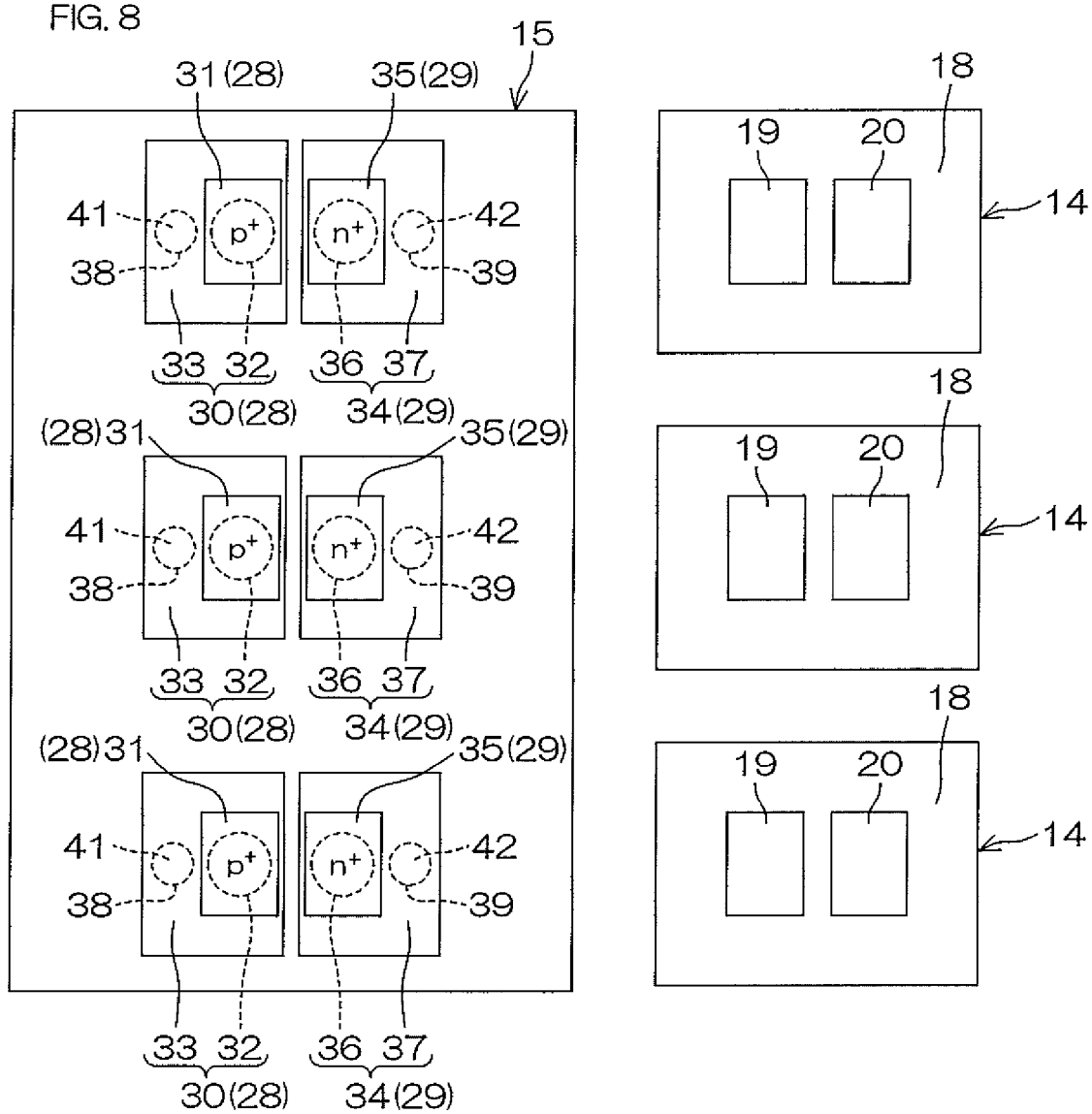
[FIG. 8] Diagrams showing modifications of the LED chip and the diode chip of FIG. 2, with FIG. 8(a) and FIG. 8(b) showing a plan view of the diode chip and a bottom plan view of the LED chip respectively.
Figure 9:
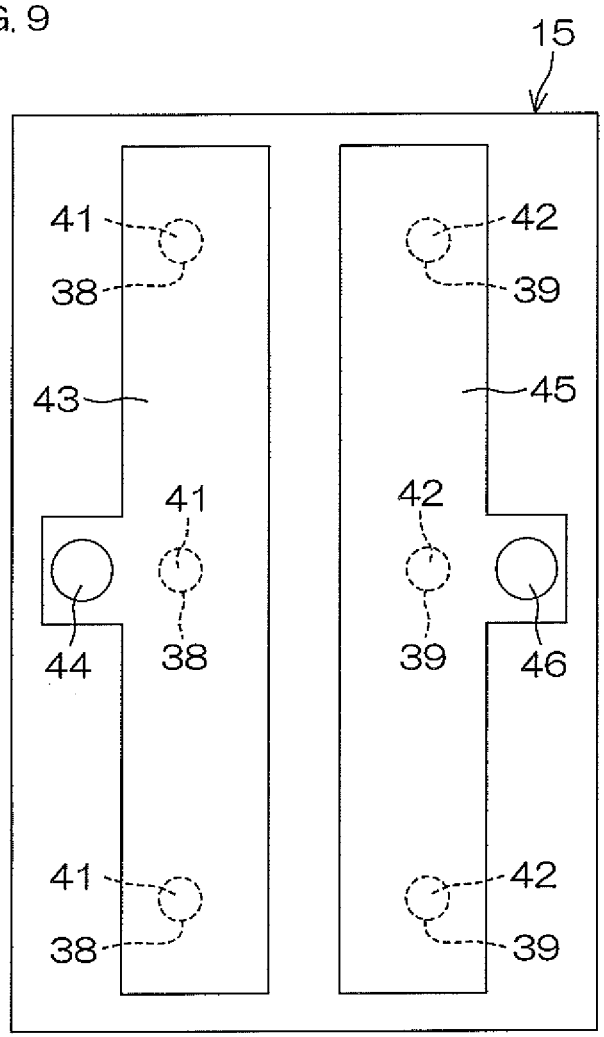
[FIG. 9] A bottom plan view of the diode chip of FIG. 8.
Figure 10:
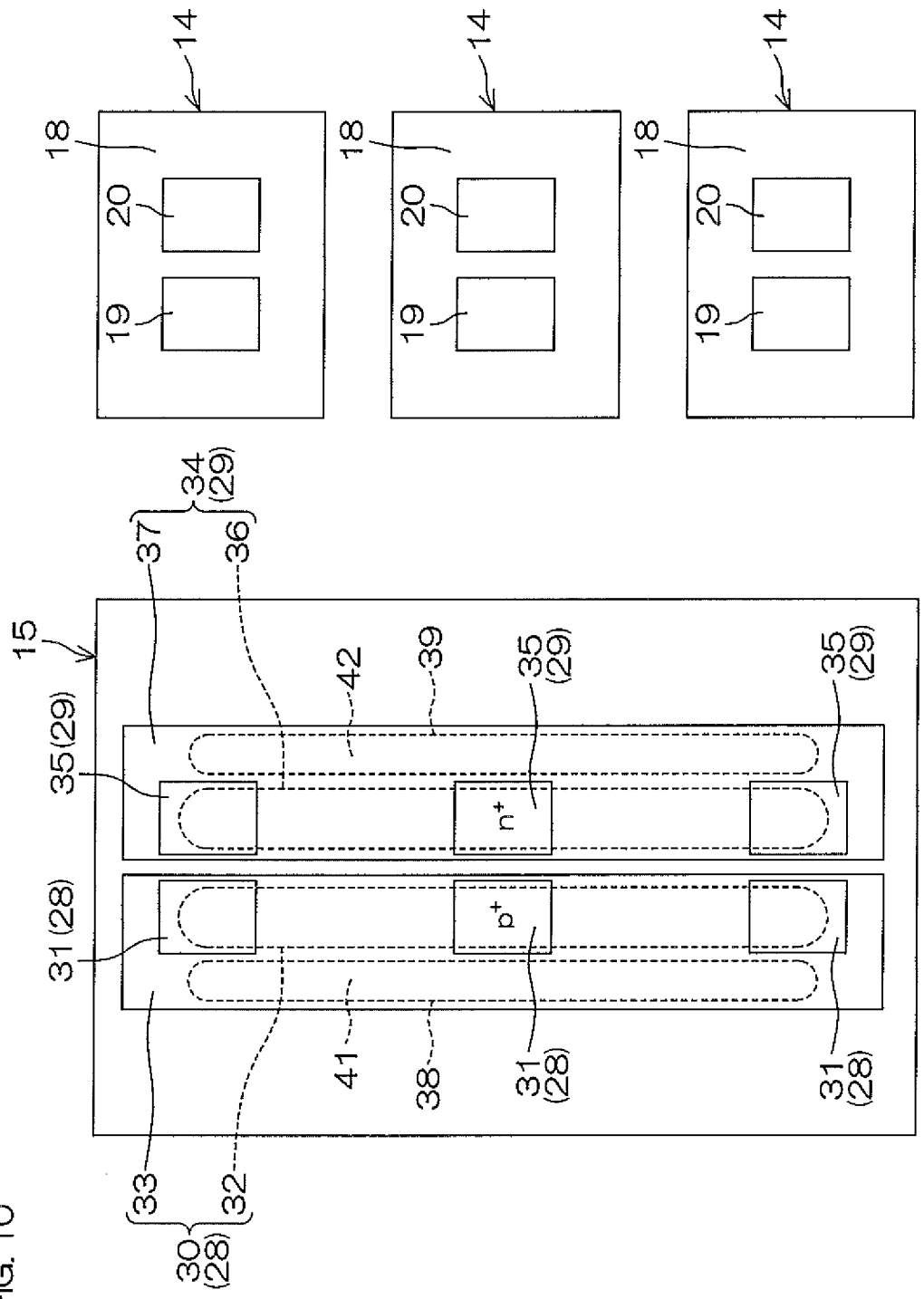
[FIG. 10] Diagrams showing modifications of the LED chip and the diode chip of FIG. 2, with FIG. 10(a) and FIG. 10(b) showing a plan view of the diode chip and a bottom plan view of the LED chip respectively.

In the LED element unit 11, the diode chip 15 may be provided to be connected to a plurality of LED chips 14. In this case, one n-side wire 30 and one p-type wire 34 may be provided on each LED chip 14, as shown in FIG. 8. In this case, the n-side island 43 and the p-side island 45 may be provided to collectively connect the n-side via 41 and the p-side via 42 connected to each n-side wire 30 and each p-side wire 34 as shown in FIG. 9, or may be provided one by one for each n-side via 41 and each p-side via 42. Further, the n-side wire 30 and the p-type wire 34 may be provided as common wires for all LED chips 14, as shown in FIG. 10. In this case, one n-side bump 31 and one p-side bump 35 may be provided for each LED chip 14. In a case of employing a larger number of LED chips 14, multilayer wires may be employed.

<Second Embodiment>

Figure 11:
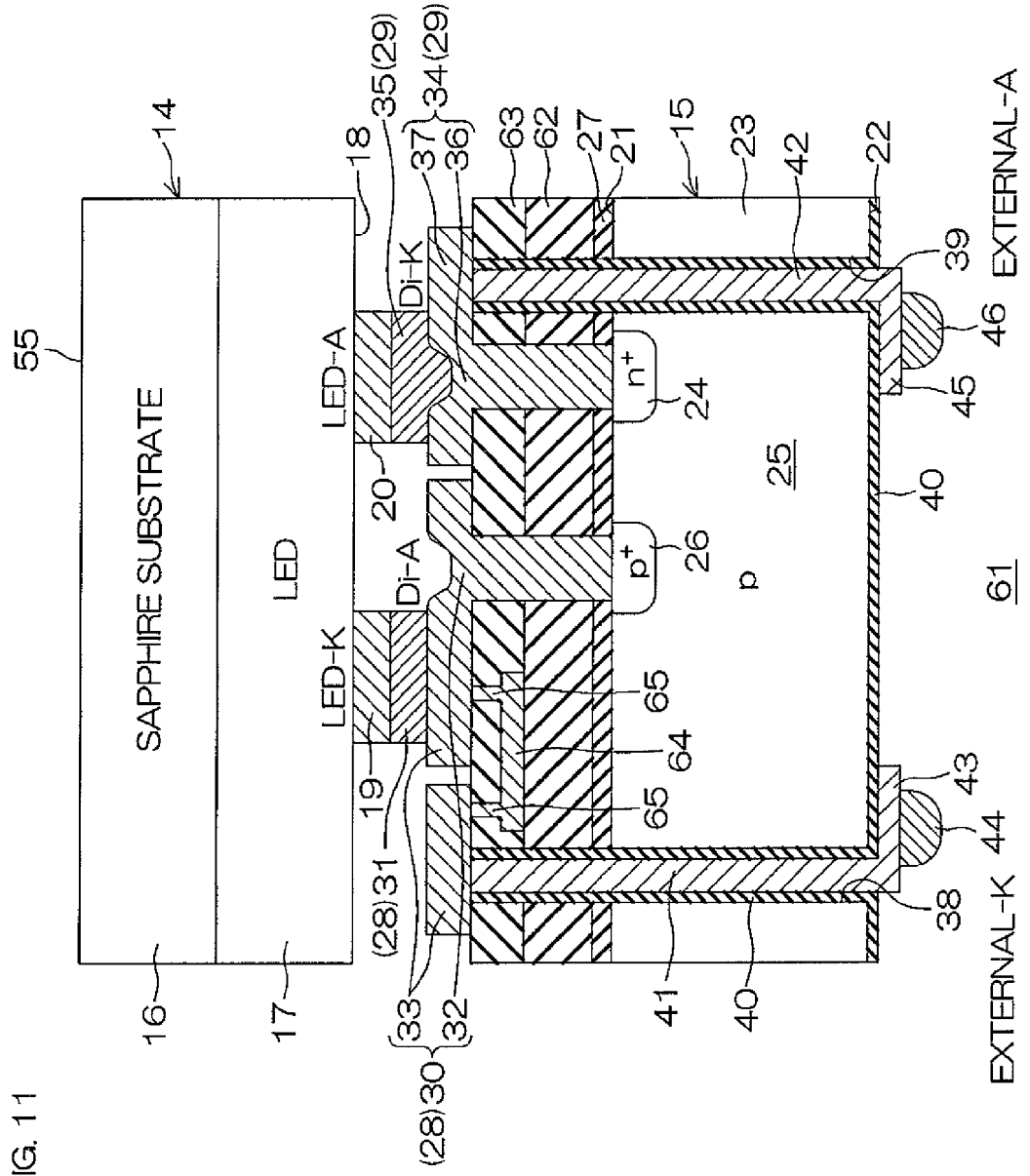
[FIG. 11] A schematic sectional view of an LED element unit according to a second embodiment of the present invention.

FIG. 11 is a schematic sectional view of an LED element unit according to a second embodiment of the present invention. Referring to FIG. 11, portions corresponding to the aforementioned respective portions shown in FIG. 2 are denoted by the same reference signs as the respective portions. In the following, detailed description as to the portions denoted by the same reference signs is omitted.

In an LED element unit 61 according to the second embodiment, a first interlayer dielectric film 62 and a second interlayer dielectric film 63 made of $SiO_2$ are successively stacked on a surface protective film 27.

An n-side wire 30 and a p-side wire 34 pass through the second interlayer dielectric film 63, the first interlayer dielectric film 62 and the surface protective film 27 from a front surface of the second interlayer dielectric film 63, and are connected to an $n^+$-type region 24 and a $p^+$-type contact region 26 respectively.

N-side drawn-out portions 33 of the n-side wire 30 are segmented along a direction across a draw-out direction thereof. A resistive element 64 made of polysilicon is formed on the first interlayer dielectric film 62, to extend between the segmented n-side drawn-out portions 33.

The resistive element 64 is connected to the segmented respective n-side drawn-out portions 33 by plugs 65. Thus, it follows that the resistive element 64 is connected in series between a position of the n-side wire 30 to which an n-side via 41 is connected and a position (a position of an n-side contact portion 32) to which an n-side bump 31 is connected.

Also according to the LED element unit 61 of the second embodiment, functions/effects similar to those of the LED element unit 11 according to the first embodiment can be exhibited.

In the LED element unit 61, further, the resistive element 64 is connected in series to the n-side wire 30, whereby a current flowing in an LED chip 14 can be excellently controlled to the rated current of the LED chip 14 by properly setting the resistance value of the resistive element 64.

In the second embodiment, the first interlayer dielectric film 62 may be omitted, and the resistive element 64 may be formed on the surface protective film 27.

<Third Embodiment>

Figure 12:
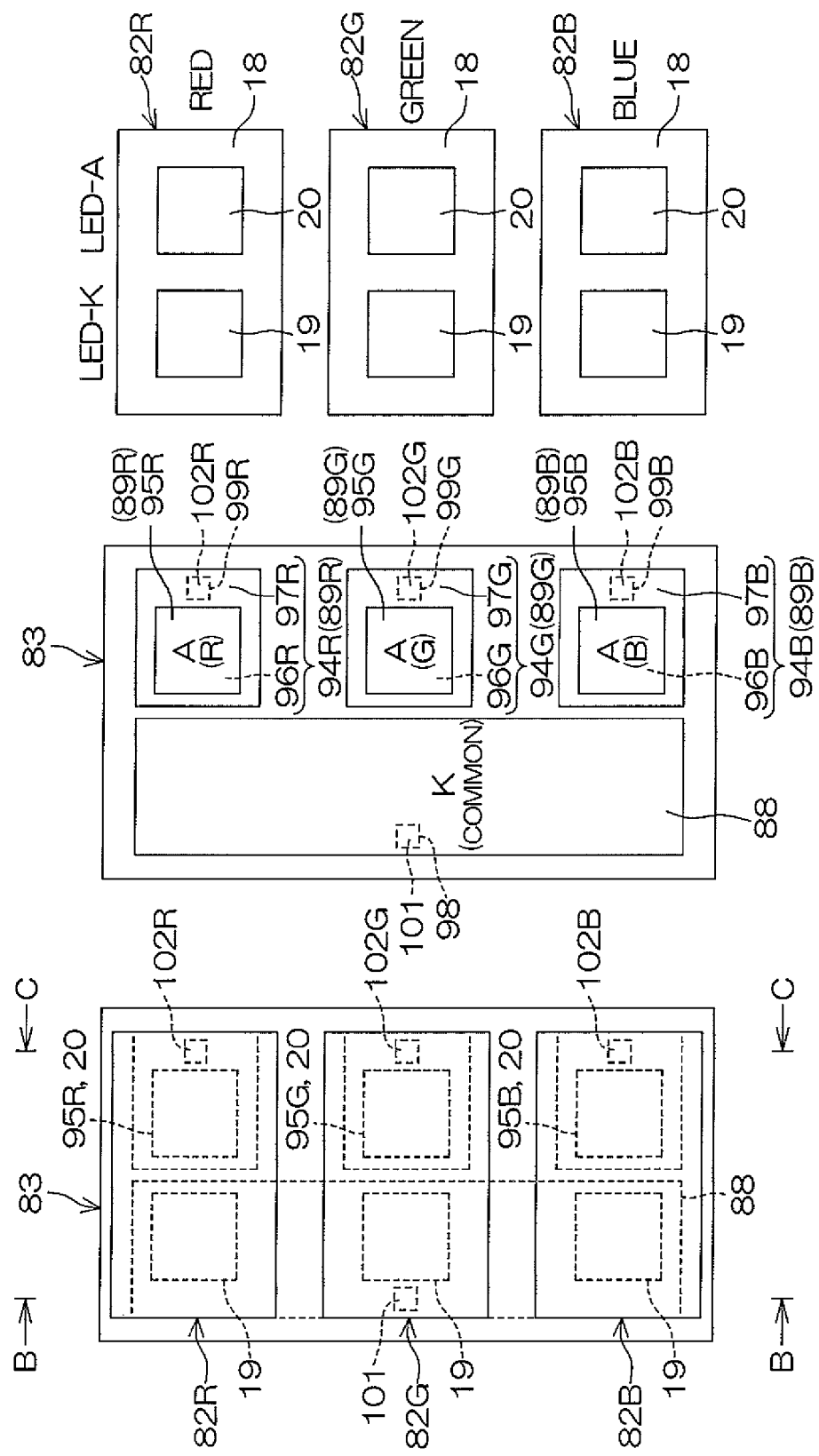
[FIG. 12] Schematic diagrams of an LED element unit according to a third embodiment of the present invention, with FIG. 12(a), FIG. 12(b) and FIG. 12(c) showing a plan view of the whole, a plan view of an LED driver and a bottom plan view of an LED chip respectively.
Figure 13:
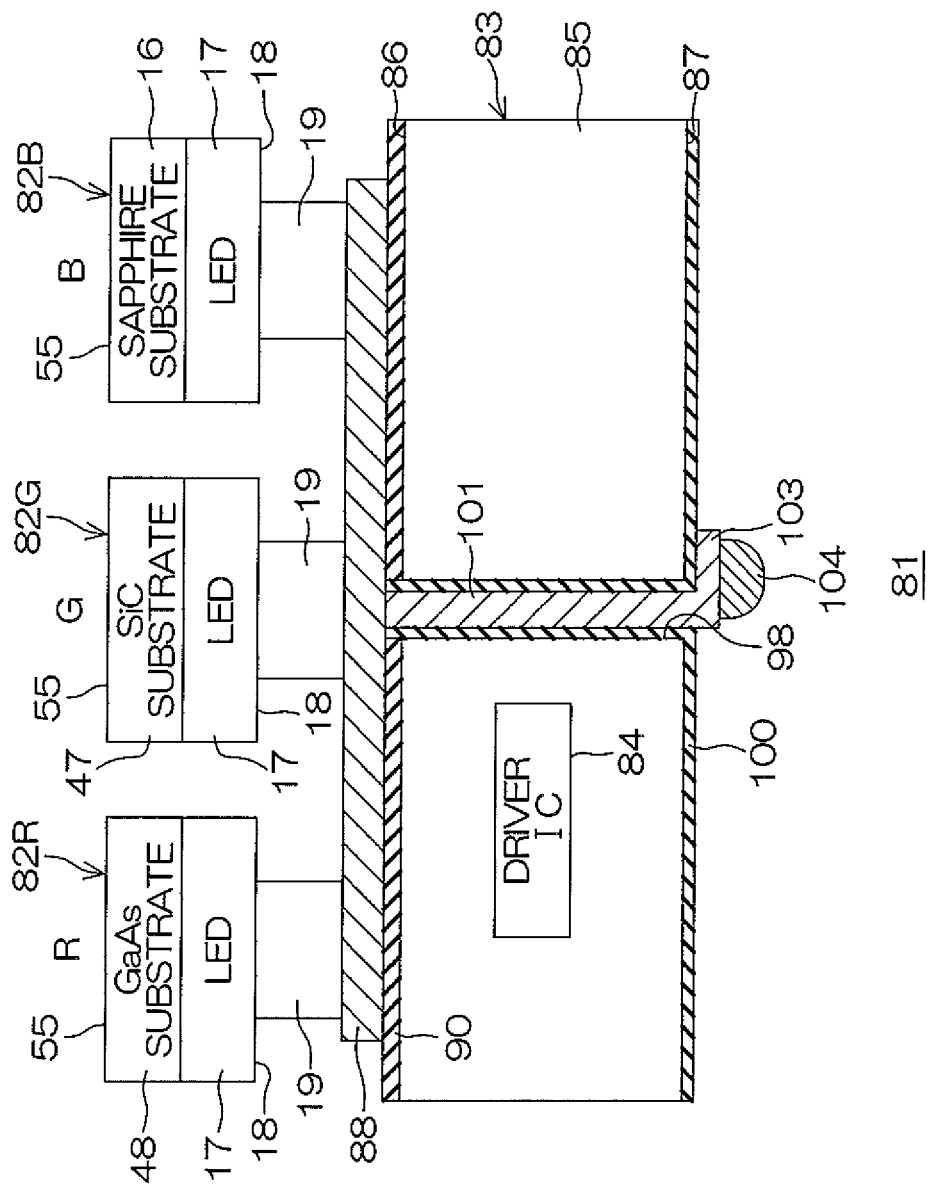
[FIG. 13] A sectional view of the LED element unit shown in FIG. 12(a), showing a section along a cutting plane line B-B in FIG. 12(a).
Figure 14:
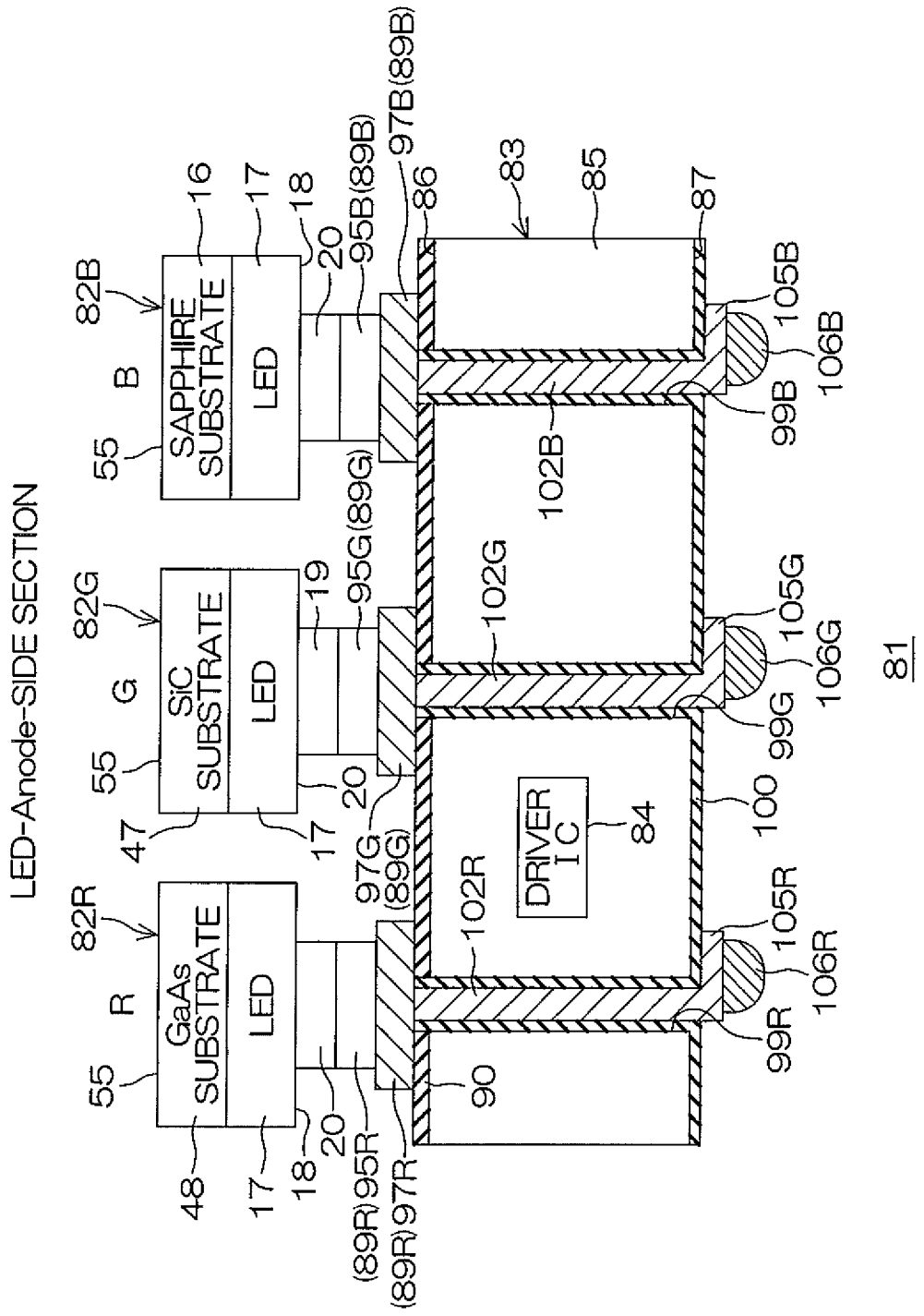
[FIG. 14] A sectional view of the LED element unit shown in FIG. 12(a), showing a section along a cutting plane line C-C in FIG. 12(a).

FIG. 12 are schematic diagrams of an LED element unit according to a third embodiment of the present invention, with FIG. 12(a), FIG. 12(b) and FIG. 12(c) showing a plan view of the whole, a plan view of an LED driver and a bottom plan view of an LED chip respectively. FIG. 13 is a sectional view of the LED element unit shown in FIG. 12(a), showing a section along a cutting plane line B-B in FIG. 12(a). FIG. 14 is a sectional view of the LED element unit shown in FIG. 12(a), showing a section along a cutting plane line C-C in FIG. 12(a). Referring to FIGS. 12(a) to (c), FIG. 13 and FIG. 14, portions corresponding to the aforementioned respective portions shown in FIG. 2 and FIG. 3 are denoted by the same reference signs as the respective portions. In the following, detailed description as to the portions denoted by the same reference signs is omitted.

An LED element unit 81 according to the third embodiment includes a plurality of LED chips 82R, 82G and 82B and an LED driver 83 as a driving element collectively supporting the plurality of LED chips 82R, 82G and 82B.

The plurality of LED chips 82R, 82G and 82B are a red LED chip 82R (whose emission wavelength is 615 nm to 665 nm), a green LED chip 82G (whose emission wavelength is 515 nm to 540 nm) and a blue LED chip 82B (whose emission wavelength is 445 nm to 480 nm), whose emission wavelengths are different from one another. The green LED chip 82G has an SiC substrate 47 in place of a sapphire substrate 16, and is prepared by forming an LED layer 17 on one major surface of the SiC substrate 47. The red LED chip 82R has a GaAs substrate 48 in place of the sapphire substrate 16, and is prepared by forming an LED layer 17 on one major surface of the GaAs substrate 48.

The LED driver 83 has a silicon substrate 85 provided with a driver IC 84 (a driving circuit) driving the individual LED chips 82R, 82G and 82B. A surface protective film 90 made of $SiO_2$ is formed on a front surface 86 of the silicon substrate 85.

A cathode electrode 88 as a second n-side electrode and anode electrodes 89R, 89G and 89B as second p-side electrodes are formed on the surface protective film 90, adjacently to one another. The cathode electrode 88 is an electrode common to the three LED chips 82R, 82G and 82B. On the other hand, the anode electrodes 89R, 89G and 89B are provided one by one for the respective LED chips 82R, 82G and 82B, i.e. in three in total.

The anode electrodes 89R, 89G and 89B include anode wires 94R, 94G and 94B and anode bumps 95R, 95G and 95B provided one by one for the respective LED chips 82R, 82G and 82B respectively.

The respective anode wires 94R, 94G and 94B integrally have anode contact portions 96R, 96G and 96B with which the anode bumps 95R, 95G and 95B are brought into contact and anode drawn-out portions 97R, 97G and 97B drawn out from the anode contact portions 96R, 96G and 96B on a side opposite to the cathode electrode 88 in plan view.

The silicon substrate 85 is provided with a cathode via hole 98 and anode via holes 99R, 99G and 99B passing through the surface protective film 90 from a rear surface 87 thereof to reach the respective ones of the cathode electrode 88 and the anode wire 94R, 94G and 94B. The cathode via hole 98 and the anode via holes 99R, 99G and 99B are quadrangularly formed in plan view, for example. One cathode via hole 98 is provided for the common cathode electrode 88. On the other hand, the anode via holes 99R, 99G and 99B are provided one by one for the respective LED chips 82R, 82G and 82B, i.e., by three in total.

The anode via holes 99R, 99G and 99B are arranged on positions overlapping the anode drawn-out portions 97R, 97G and 97B in plan view.

An insulating film 100 made of $SiO_2$ is integrally formed on the inner surfaces of the cathode via hole 98 and the anode via holes 99R, 99G and 99B and the rear surface 87 of the silicon substrate 85.

A cathode via 101 and anode vias 102R, 102G and 102B made of Cu are formed to fill up the inner sides of the insulating film 100 in the cathode via hole 98 and the anode via holes 99R, 99G and 99B. It follows that the cathode via 101 is connected to the cathode electrode 88 and the anode vias 102R, 102G and 102B are connected to the anode drawn-out portions 97R, 97G and 97B.

A cathode island 103 drawn out from the cathode via 101 along the rear surface 87 of the silicon substrate 85 is formed on a portion of the insulating film 100 located on the rear surface 87 of the silicon substrate 85, integrally with the cathode via 101. A cathode external bump 104 made of solder as a cathode external electrode is bonded to the cathode island 103.

Anode islands 105R, 105G and 105B drawn out from the anode vias 102R, 102G and 102B along the rear surface 87 of the silicon substrate 85 are formed on the portion of the insulating film 100 located on the rear surface 87 of the silicon substrate 85, integrally with the anode vias 102R, 102G and 102B. Anode external bumps 106R, 106G and 106B made of solder as anode external electrodes are bonded to the anode islands 105R, 105G and 105B.

A bumpy LED cathode electrode 19 and the cathode electrode 88 as well as a bumpy LED anode electrode 20 and the anode bumps 95R, 95G and 95B are so bonded to one another respectively that the red LED chip 82R, the green LED chip 82G and the blue LED chip 82B are supported by the LED driver 83 from below in facedown postures downwardly directing front surfaces 18 of the LED layers 17 (FIG. 12(a) and FIG. 13).

According to the LED element unit 81, as hereinabove described, the plurality of LED chips (the red LED chip 82R, the green LED chip 82G and the blue LED chip 82B) are bonded to the LED driver 83 in the so-called facedown postures downwardly directing surfaces (the front surfaces 18) of the LED layers 17 for forming the electrodes. Thus, the LED chips 82R, 82G and 82B and the LED driver 83 can be brought into a stack structure, whereby downsizing (shrinking) of the LED element unit 81 can be attained.

Further, the cathode electrode 88 and the anode electrodes 89R, 89G and 89B bonded to the respective ones of the LED cathode electrodes 19 and the LED anode electrodes 20 of the respective LED chips 82R, 82G and 82B are connected to the cathode external bump 104 and the anode external bumps 106R, 106G and 106B respectively by the cathode via 101 and the anode vias 102, 102G and 102B passing through the silicon substrate 85 in the thickness direction.

The side surfaces of the cathode via 101 and the anode vias 102R, 102G and 102B are covered with the insulating film 100, whereby the cathode via 101 and the anode vias 102R, 102G and 102B are insulated from the silicon substrate 85. Therefore, the vias (the cathode via 101 and the anode vias 102R, 102G and 102B) and the silicon substrate 85 can be prevented from short-circuiting when power is supplied from the cathode external bump 104 and the anode external bumps 106R, 106G and 106B to the LED chips 82R, 82G and 82B through the vias (the cathode via 101 and the anode vias 102R, 102G and 102B). Consequently, power can be normally supplied to the LED chips 82R, 82G and 82B.

While the embodiments of the present invention have been described, the present invention can be embodied in other ways.

For example, the element brought into the stack structure along with the LED chip is not restricted to the element (the diode chip 15 or the LED driver 83) illustrated in each of the aforementioned first to third embodiments, but may be a variable resistive element or the like.

The material for the insulating film 40 or 100 covering the side surface of each via is not restricted to $SiO_2$, but may be SiN or the like.

While the vias (the n-side via 41 and the p-side via 42) passing through the p-type silicon substrate 23 are formed on both of the cathode side (the n-side) and the anode side (the p-side) in each of the aforementioned first and second embodiments, either one may be omitted.

In each of the first to third embodiments, a structure inverting the conductivity types of the respective semiconductor regions may be employed. In other words, such a structure that the n-type (first conductivity type) regions are p-type (second conductivity type) regions and the p-type regions are n-type regions may be employed in the diode chip 15.

The wire connecting the second n-side electrode 28 and the n-side external bump 44 with each other, the wire connecting the second p-side electrode 29 and the p-side external bump 46 with each other, the wire connecting the cathode electrode 88 and the cathode external bump 104 with each other and the like may not be the vias passing through the silicon substrates 23 and 85 respectively. The same may be wires or the like formed along the side surface of the silicon substrate 23 in the diode chip 15 of the LED element unit 11 according to the first embodiment, for example.

While the example in which the LED element unit 11 is loaded on the base substrate 2 has been shown in the first embodiment, the n-side external bump 44 and the p-side external bump 46 may be connected to leads of a lead frame respectively, so that the LED element unit 11 is directly loaded on the lead frame without through the base substrate 2 or the like.

The LED chips 14, 82R, 82G and 82B illustrated in the first to third embodiments are schematic, and LED elements of general structures can be employed as the LED chips 14, 82R, 82G and 82B.

Figure 15:
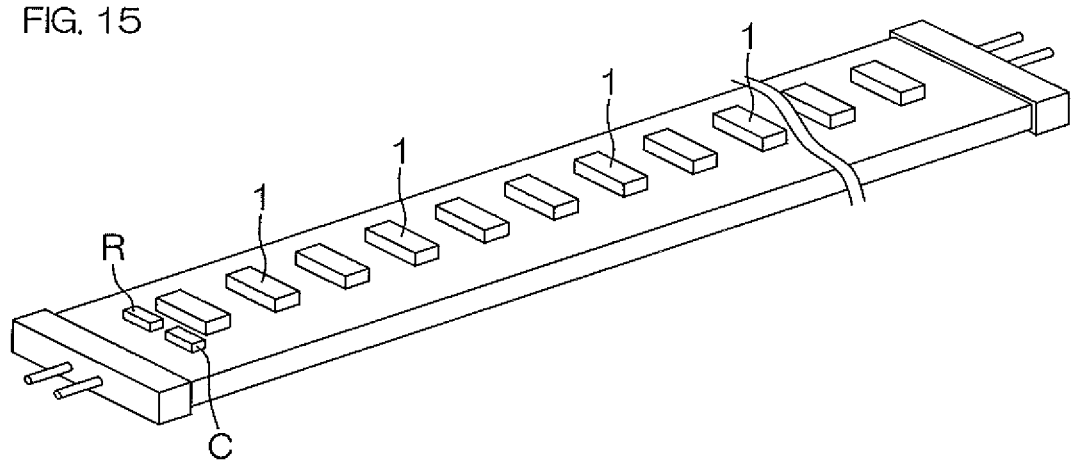
[FIG. 15] A schematic block diagram of an LED lamp loaded with an LED package.

As an example of a product to which the LED package 1 or the single LED element unit 11, 61, 71 or 81 according to each of the first to third embodiments is applied, an LED lamp, a backlight, a seven-segment display, a dot matrix display or the like can be listed, for example. As an example of the structure of the LED lamp, such a structure (R denotes a resistor, and C denotes a capacitor) that a plurality of LED packages 1 are set on a substrate 67 can be listed, as shown in FIG. 15. In the structure of FIG. 15, the single LED element unit 11, 61, 71 or 81 may be set in place of each LED packages 1.

The embodiments of the present invention are merely specific examples employed for clarifying the technical contents of the present invention, the present invention is not to be interpreted restrictively to the specific examples, and the spirit and scope of the present invention are limited only by the appended claims.

The components shown in the embodiments of the present invention can be combined with one another in the range of the present invention.

This application corresponds to Japanese Patent Application No. 2010-283366 filed with the Japan Patent Office on Dec. 20, 2010, the disclosure of which is incorporated herein by reference.

DESCRIPTION OF THE REFERENCE SIGNS

1 . . . LED package, 2 . . . base substrate, 3 . . . resin case, 8 . . . cathode terminal, 9 . . . anode terminal, 11 . . . LED element unit, 14 . . . LED chip, 15 . . . diode chip, 17 . . . LED layer, 18 . . . front surface (of LED layer), 19 . . . LED cathode electrode, 20 . . . LED anode electrode, 21 . . . front surface (of p-type silicon substrate), 22 . . . rear surface (of p-type silicon substrate), 23 . . . p-type silicon substrate, 24 . . . $n^+$-type region, 25 . . . p-type region, 26 . . . $p^+$-type contact region, 28 . . . diode anode electrode, 29 . . . diode cathode electrode, 30 . . . n-side wire, 31 . . . n-side bump, 34 . . . p-side wire, 35 . . . p-side bump, 40 . . . insulating film, 41 . . . n-side via, 42 . . . p-side via, 44 . . . n-side external bump, 46 . . . p-side external bump, 61 . . . LED element unit, 64 . . . resistive element, 81 . . . LED element unit, 82R . . . red LED chip, 82G . . . green LED chip, 82B . . . blue LED chip, 83 . . . LED driver, 84 . . . driver IC, 85 . . . silicon substrate, 86 . . . front surface (of silicon substrate), 87 . . . rear surface (of silicon substrate), 88 . . . cathode electrode, 89R, 89G, 89B . . . anode electrode, 94R, 94G, 94B . . . anode wire, 95R, 95G, 95B . . . anode bump, 100 . . . insulating film, 101 . . . cathode via, 102R, 102G, 102B . . . anode via, 105 . . . cathode external bump, 106R, 106G, 106B . . . anode external bump

The invention claimed is:

1. A light-emitting element unit comprising:
a semiconductor light-emitting element having a front surface and a rear surface so that light is extracted from the rear surface, and having a first n-side electrode and a first p-side electrode on the front surface; and
a support element having a conductive substrate having a front surface and a rear surface as well as a second n-side electrode and a second p-side electrode formed on the front surface of the conductive substrate, wherein
the first n-side electrode and the second n-side electrode, and the first p-side electrode and the second p-side electrode are so bonded to one another respectively that the semiconductor light-emitting element is supported by the support element in a facedown posture downwardly directing the front surface, and
the support element has:
an n-side external electrode and a p-side external electrode formed on the rear surface of the conductive substrate,
a conductive via passing through the conductive substrate from the front surface up to the rear surface for electrically connecting the second n-side electrode and the n-side external electrode and/or the second p-side electrode and the p-side external electrode with each other, and an insulating film formed between the via and the conductive substrate to cover the side surface of the via, wherein the second n-side electrode and the second p-side electrode connected to the via include:

wires set along the front surface of the conductive substrate and connected to the respective ones of the conductive substrate and the via, and bumps formed on the wires and bonded to the first n-side electrode or the first p-side electrode, wherein the light-emitting element unit further includes a resistive element interposed between positions of the wires to which the via is connected and positions connected with the bumps.

2. The light-emitting element unit according to claim 1, wherein the first n-side electrode and the first p-side electrode connected to the bumps are provided in the form of bumps made of the same metallic material as the bumps.

3. The light-emitting element unit according to claim 1, wherein the bumps are made of Au.

4. The light-emitting element unit according to claim 1, wherein the wires are made of Al.

5. The light-emitting element unit according to claim 1, wherein the conductive substrate has a p-type region to which the second n-side electrode is connected and an n-type region to which the second p-side electrode is connected, the support element includes a Zener diode having a p-n junction of the n-type region and the p-type region, and the via includes an n-side via and a p-side via connected to the respective ones of the second n-side electrode and the second p-side electrode.

6. The light-emitting element unit according to claim 5, wherein the conductive substrate is a p-type semiconductor substrate as the p-type region, and the n-type region is a region floated on a surface layer portion of the p-type semiconductor substrate.

7. The light-emitting element according to claim 6, wherein the p-side via passes through the p-type semiconductor substrate, not to be in contact with the floated n-type region.

8. The light-emitting element unit according to claim 7, wherein the p-type semiconductor substrate includes a p$^+$-type contact region formed adjacently to the n-type region on the surface layer portion thereof so that the second n-side electrode is connected thereto, the p-side via is formed on a side of the n-type region opposite to the p$^+$-type contact region, and the n-side via is formed on a side of the p$^+$-type contact region opposite to the n-type region.

9. The light-emitting element unit according to claim 7, wherein the p-type semiconductor substrate include a p$^+$-type contact region, and wherein the n-side via, the n-type region, the p$^+$-type contact region and the p-side via are arranged on the same straight line in plan view.

10. The light-emitting element unit according to claim 1, wherein the conductive substrate has a driving circuit driving a plurality of semiconductor light-emitting elements respectively, the support element includes a driving element supporting the plurality of semiconductor light-emitting elements, and the via is electrically connected to the respective ones of the second n-side electrode and the second p-side electrode.

11. The light-emitting element unit according to claim 10, wherein the plurality of semiconductor light-emitting elements are light-emitting elements whose emission wavelengths are different from one another.

12. The light-emitting element unit according to claim 10, wherein the plurality of semiconductor light-emitting elements include a red LED element, a green LED element and a blue LED element.

13. The light-emitting element unit according to claim 12, wherein the first n-side electrodes of the respective ones of the red LED element, the green LED element and the blue LED element are connected to the common second n-side electrode.

14. A light-emitting element package comprising:
the emitting element unit according to claim 1;
a base substrate supporting the light-emitting element unit and having a cathode terminal and an anode terminal electrically connected to the respective ones of the n-side external electrode and the p-side external electrode of the light-emitting element unit; and
a resin case formed on the base substrate to surround the light-emitting element.

15. A surface mount light-emitting element unit comprising:

a base substrate having a cathode terminal and an anode terminal;

a support element having a conductive substrate having a front surface and a rear surface, an n-side electrode and a p-side electrode formed on the front surface of the conductive substrate, and an n-side external electrode and a p-side external electrode formed on the rear surface of the conductive substrate to be electrically connected to the cathode terminal and the anode terminal respectively;

a semiconductor light-emitting element having a front surface and a rear surface so that light is extracted from the rear surface, and having a cathode-side electrode and an anode-side electrode on the front surface, in which the cathode-side electrode and the n-side electrode as well as the anode-side electrode and the p-side external electrode are so bonded to one another respectively that the semiconductor light-emitting element is supported by the support element in a facedown posture downwardly directing the front surface for constituting a light-emitting element circuit having a protective circuit in association with the support element; and a resin case formed on a side of a surface of the base substrate loaded with the support element for surrounding the support element and the semiconductor light-emitting element, wherein the n-side electrode and the p-side electrode include:
wires set along the front surface of the conductive substrate and connected to the conductive substrate, and
bumps formed on the wires and bonded to the cathode-side electrode or the anode-side electrode
wherein the surface mount light-emitting element unit further comprises a resistive element interposed between positions of the wires to which the conductive substrate is connected and positions connected with the bumps.

16. The surface mount light-emitting element unit according to claim 15, wherein the cathode-side electrode and the anode-side electrode connected to the bumps are provided in the form of bumps made of the same metallic material as the bumps.

17. The surface mount light-emitting element unit according to claim 15, wherein the bumps are made of Au.

18. The surface mount light-emitting element unit according to claim 15, wherein the wires are made of Al.

19. The surface mount light-emitting element unit according to claim 15, wherein
the conductive substrate has a p-type region to which the n-side electrode is connected and an n-type region to which the p-side electrode is connected, and
the support element includes a Zener diode having a p-n junction of the n-type region and the p-type region.

20. The surface mount light-emitting element unit according to claim 19, wherein
the conductive substrate is a p-type semiconductor substrate as the p-type region, and
the n-type region is a region floated on a surface layer portion of the p-type semiconductor substrate.

21. The surface mount light-emitting element unit according to claim 15, wherein
the conductive substrate includes a driving circuit driving a plurality of semiconductor light-emitting elements respectively, and
the support element includes a driving element supporting the plurality of semiconductor light-emitting elements.

22. The surface mount light-emitting element unit according to claim 21, wherein
the plurality of semiconductor light-emitting elements are light-emitting elements whose emission wavelengths are different from one another.

23. The surface mount light-emitting element unit according to claim 21, wherein the plurality of semiconductor light-emitting elements include a red LED element, a green LED element and a blue LED element.

24. The surface mount light-emitting element unit according to claim 23, wherein
the cathode-side electrodes of the respective ones of the red LED element, the green LED element and the blue LED element are connected to the common n-side electrode.

25. The surface mount light-emitting element unit according to claim 15, wherein the conductive substrate includes an n-side via and a p-side via passing through the conductive substrate from the front surface up to the rear surface for electrically connecting the n-side electrode and the n-side external electrode as well as the p-side electrode and the p-side external electrode with one another respectively.

26. The surface mount light-emitting element unit according to claim 25, wherein
the conductive substrate is a p-type semiconductor substrate as the p-type region,
the n-type region is a region floated on a surface layer portion of the p-type semiconductor substrate, and
the p-side via passes through the p-type semiconductor substrate not to be in contact with the floated n-type region.

27. The surface mount light-emitting element unit according to claim 26, wherein
the p-type semiconductor substrate includes a $p^+$-type contact region formed adjacently to the n-type region on the surface layer portion thereof so that the n-side electrode is connected thereto,
the p-side via is formed on a side of the n-type region opposite to the $p^+$-type contact region, and
the n-side via is formed on a side of the $p^+$-type contact region opposite to the n-type region.

28. The surface mount light-emitting element unit according to claim 27, wherein the n-side via, the n-type region, the $p^+$-type contact region and the p-side via are arranged on the same straight line in plan view.

29. The surface mount light-emitting element unit according to claim 15, further comprising:
white resin injected into the resin case to cover at least a part of at least the support element, and
wavelength converting resin injected into the periphery of the semiconductor light-emitting element in the resin case.

30. The surface mount light-emitting element unit according to claim 29, wherein
the thickness of the white resin is relatively small in a portion covering the support element and relatively large in a portion in contact with the resin case.

31. A light-emitting element unit comprising:
a semiconductor light-emitting element having a front surface and a rear surface so that light is extracted from the rear surface, and having a first n-side electrode and a first p-side electrode on the front surface; and
a support element having a conductive substrate having a front surface and a rear surface as well as a second n-side electrode and a second p-side electrode formed on the front surface of the conductive substrate, wherein
the first n-side electrode and the second n-side electrode, and the first p-side electrode and the second p-side electrode are so bonded to one another respectively that the semiconductor light-emitting element is supported by the support element in a facedown posture downwardly directing the front surface, and
the support element has:
an n-side external electrode and a p-side external electrode formed on the rear surface of the conductive substrate,
a conductive via passing through the conductive substrate from the front surface up to the rear surface for electrically connecting the second n-side electrode and the n-side external electrode and/or the second p-side electrode and the p-side external electrode with each other, and
an insulating film formed between the via and the conductive substrate to cover the side surface of the via,
wherein the conductive substrate is a p-type semiconductor substrate including a p-type region to which the second n-side electrode is connected,
an n-type region to which the second p-side electrode is connected is floated on a surface layer portion of the p-type semiconductor substrate,
the support element includes a Zener diode having a p-n junction of the n-type region and the p-type region,
the via includes an n-side via and a p-side via connected to the respective ones of the second n-side electrode and the second p-side electrode,
the p-side via passes through the p-type semiconductor substrate, not to be in contact with the floated n-type region,
the p-type semiconductor substrate includes a $p^+$-type contact region formed adjacently to the n-type region on the surface layer portion thereof so that the second n-side electrode is connected thereto,
the p-side via is formed on a side of the n-type region opposite to the $p^+$-type contact region, and
the n-side via is formed on a side of the $p^+$-type contact region opposite to the n-type region.

32. A light-emitting element unit comprising:
a semiconductor light-emitting element having a front surface and a rear surface so that light is extracted from the rear surface, and having a first n-side electrode and a first p-side electrode on the front surface; and
a support element having a conductive substrate having a front surface and a rear surface as well as a second n-side electrode and a second p-side electrode formed on the front surface of the conductive substrate, wherein
the first n-side electrode and the second n-side electrode, and the first p-side electrode and the second p-side electrode are so bonded to one another respectively that the semiconductor light-emitting element is supported by the support element in a facedown posture downwardly directing the front surface, and
the support element has:
an n-side external electrode and a p-side external electrode formed on the rear surface of the conductive substrate,
a conductive via passing through the conductive substrate from the front surface up to the rear surface for electrically connecting the second n-side electrode and the n-side external electrode and/or the second p-side electrode and the p-side external electrode with each other, and
an insulating film formed between the via and the conductive substrate to cover the side surface of the via,
wherein the conductive substrate has a driving circuit driving a plurality of semiconductor light-emitting elements respectively,
the support element includes a driving element supporting the plurality of semiconductor light-emitting elements,
the via is electrically connected to the respective ones of the second n-side electrode and the second p-side electrode,
the plurality of semiconductor light-emitting elements include a red LED element, a green LED element and a blue LED element, and
the first n-side electrodes of the respective ones of the red LED element, the green LED element and the blue LED element are connected to the common second n-side electrode.

33. A surface mount light-emitting element unit comprising:
a base substrate having a cathode terminal and an anode terminal;
a support element having a conductive substrate having a front surface and a rear surface, an n-side electrode and a p-side electrode formed on the front surface of the conductive substrate, and an n-side external electrode and a p-side external electrode formed on the rear surface of the conductive substrate to be electrically connected to the cathode terminal and the anode terminal respectively;
a semiconductor light-emitting element having a front surface and a rear surface so that light is extracted from the rear surface, and having a cathode-side electrode and an anode-side electrode on the front surface, in which the cathode-side electrode and the n-side electrode as well as the anode-side electrode and the p-side external electrode are so bonded to one another respectively that the semiconductor light-emitting element is supported by the support element in a facedown posture downwardly directing the front surface for constituting a light-emitting element circuit having a protective circuit in association with the support element; and
a resin case formed on a side of a surface of the base substrate loaded with the support element for surrounding the support element and the semiconductor light-emitting element, wherein
the conductive substrate includes a driving circuit driving a plurality of semiconductor light-emitting elements respectively, and
the support element includes a driving element supporting the plurality of semiconductor light-emitting elements,
the plurality of semiconductor light-emitting elements include a red LED element, a green LED element and a blue LED element, and
the cathode-side electrodes of the respective ones of the red LED element, the green LED element and the blue LED element are connected to the common n-side electrode.

34. A surface mount light-emitting element unit comprising:
a base substrate having a cathode terminal and an anode terminal;
a support element having a conductive substrate having a front surface and a rear surface, an n-side electrode and a p-side electrode formed on the front surface of the conductive substrate, and an n-side external electrode and a p-side external electrode formed on the rear surface of the conductive substrate to be electrically connected to the cathode terminal and the anode terminal respectively;
a semiconductor light-emitting element having a front surface and a rear surface so that light is extracted from the rear surface, and having a cathode-side electrode and an anode-side electrode on the front surface, in which the cathode-side electrode and the n-side electrode as well as the anode-side electrode and the p-side external electrode are so bonded to one another respectively that the semiconductor light-emitting element is supported by the support element in a facedown posture downwardly directing the front surface for constituting a light-emitting element circuit having a protective circuit in association with the support element; and
a resin case formed on a side of a surface of the base substrate loaded with the support element for surrounding the support element and the semiconductor light-emitting element, wherein
the conductive substrate includes an n-side via and a p-side via passing through the conductive substrate from the front surface up to the rear surface for electrically connecting the n-side electrode and the n-side external electrode as well as the p-side electrode and the p-side external electrode with one another respectively,
the conductive substrate is a p-type semiconductor substrate as the p-type region,
the n-type region is a region floated on a surface layer portion of the p-type semiconductor substrate,
the p-side via passes through the p-type semiconductor substrate not to be in contact with the floated n-type region,
the p-type semiconductor substrate includes a $p^+$-type contact region formed adjacently to the n-type region on the surface layer portion thereof so that the n-side electrode is connected thereto,
the p-side via is formed on a side of the n-type region opposite to the $p^+$-type contact region, and
the n-side via is formed on a side of the $p^+$-type contact region opposite to the n-type region.

* * * * *